(12) United States Patent
Minami et al.

(10) Patent No.: US 7,611,942 B2
(45) Date of Patent: Nov. 3, 2009

(54) SEMICONDUCTOR INTEGRATED CIRCUIT DEVICE AND A METHOD OF MANUFACTURING THE SAME

(75) Inventors: Shinichi Minami, Kodaira (JP); Fukuo Oowada, Hitachinaka (JP); Xiaudong Fang, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 585 days.

(21) Appl. No.: 11/203,272

(22) Filed: Aug. 15, 2005

(65) Prior Publication Data
US 2005/0269663 A1    Dec. 8, 2005

Related U.S. Application Data

(62) Division of application No. 10/736,794, filed on Dec. 17, 2003, now Pat. No. 7,011,999.

(30) Foreign Application Priority Data
Dec. 19, 2002    (JP)    ............... 2002-368666

(51) Int. Cl.
*H01L 21/8238*    (2006.01)
(52) U.S. Cl. ............... 438/210; 257/E21.008
(58) Field of Classification Search ........ 438/210, 438/238, 239, 381, 382, 250, 253
See application file for complete search history.

(56) References Cited

U.S. PATENT DOCUMENTS

| | | | | |
|---|---|---|---|---|
| 5,970,362 A * | 10/1999 | Lyons et al. | ............. | 438/424 |
| 6,156,594 A | 12/2000 | Gris | | |
| 6,180,462 B1 * | 1/2001 | Hsu | ............. | 438/275 |
| 6,410,387 B1 | 6/2002 | Cappelletti et al. | | |
| 2002/0022314 A1* | 2/2002 | Tuan et al. | ............. | 438/239 |
| 2002/0041526 A1* | 4/2002 | Sugita et al. | ............. | 365/200 |

FOREIGN PATENT DOCUMENTS

| JP | 2000-164835 | 6/2000 |
|---|---|---|
| JP | 2000-269449 | 9/2000 |

* cited by examiner

*Primary Examiner*—Alexander G Ghyka
*Assistant Examiner*—Reema Patel
(74) *Attorney, Agent, or Firm*—Antonelli, Terry, Stout & Kraus, LLP.

(57) ABSTRACT

A semiconductor integrated circuit device having a capacitor element, including a lower electrode provided over an element isolation region of a principal surface of a semiconductor substrate, and an upper electrode provided over the lower electrode with a dielectric film interposed therebetween, has oxidation resistant films disposed between the element isolation region of the principal surface of the semiconductor substrate and the lower electrode, and between the lower electrode and the upper electrode.

13 Claims, 26 Drawing Sheets

SEMICONDUCTOR INTEGRATED CIRCUIT DEVICE AND A METHOD OF MANUFACTURING THE SAME

CROSS-REFERENCE TO RELATED APPLICATIONS

This application is a Divisional Application of application Ser. No. 10/736,794, filed Dec. 17, 2003, now U.S. Pat. No. 7,011,999 the entire disclosure of which is hereby incorporated by reference.

TECHNICAL FIELD

The present invention relates to a semiconductor device and to a technique to be used in the manufacture thereof. More particularly, it relates to a technique that is effectively applicable to a system IC (Integrated Circuit) having a nonvolatile storage element, and a capacitor element or a resistor element.

BACKGROUND OF THE INVENTION

As an example of a semiconductor integrated circuit device, a nonvolatile storage device, designated as, for example, a flash memory or an EEPROM (Electrically Erasable Programmable Read Only Memory), is known. As an example of a flash memory, there is a memory cell of a one-transistor system in which the memory cell is composed of one nonvolatile storage element, or a memory cell of a two-transistor system in which one nonvolatile storage element and one selecting MISFET (Metal Insulator Semiconductor Field Effect Transistor) are connected in series. Whereas, for the nonvolatile storage element, there is a floating gate type in which information is stored in a floating gate electrode between a semiconductor substrate and a control gate electrode, a MNOS (Metal Nitride Oxide Semiconductor) in which a NO (Nitride/Oxide) film is used as a gate insulating film between a semiconductor substrate and a gate electrode, so that information is stored in this gate insulating film, and a MONOS (Metal Oxide Nitride Oxide Semiconductor) type in which an ONO (Oxide/Nitride/Oxide) film is used as a gate insulating film between a semiconductor substrate and a gate electrode, so that information is stored in this gate insulating film, or the like. Further, for the floating gate type, there is also one using an ONO film for an interlayer insulating film between a floating gate electrode and a control gate electrode.

On the other hand, in the semiconductor integrated circuit device, not only active elements, such as MISFETs, but also passive elements, such as resistor elements and capacitor elements, are generally present in a large number. These elements are used in, for example, a delay circuit, a load element, an oscillation circuit, and a bypass capacitor for stabilizing the power supply. Also, for resistor elements and capacitor elements, ones having various structures are known. For example, as resistor elements, there are a diffused resistor element formed by doping impurities into the semiconductor substrate and a polycrystal silicon resistor element formed of a polycrystal silicon film. As capacitor elements, there are a capacitor element in which a semiconductive region (impurity diffused region) formed by doping impurities into a semiconductor substrate serves as a lower electrode, and a conductive film disposed over the lower electrode via a dielectric film interposed therebetween serves as an upper electrode, and a capacitor element in which a conductive film disposed over an element isolation region of a principal surface of a semiconductor substrate serves as a lower electrode, and a conductive film disposed over the lower electrode via a dielectric film interposed therebetween serves as an upper electrode, and the like. Whereas, for the capacitor element, a capacitor element using the ONO film described above as a dielectric film is also known.

Incidentally, documents regarding the present invention include the following: Patent Document 1 (Japanese Unexamined Patent Publication No. 2000-269449) and Patent Document 2 (Japanese Unexamined Patent Publication No. 2000-164835). Patent Document 1 discloses a manufacturing technique for use in the fabrication of a semiconductor integrated circuit device having a nonvolatile memory of a floating gate structure, and a capacitor element. Patent Document 2 discloses a manufacturing technique for use in the fabrication of an integrated circuit having a nonvolatile memory of a floating gate structure, a high breakdown voltage transistor, and a low breakdown voltage transistor.

[Patent Document 1]

Japanese Unexamined Patent Publication No. 2000-269449

[Patent Document 1]

Japanese Unexamined Patent Publication No. 2000-164835

SUMMARY OF THE INVENTION

In recent years, at the frontier of technology, such as multimedia or information communication, a system on chip structure, in which a microcomputer, a DRAM, an ASIC (Application Specific Integrated Circuit), a flash memory, and the like are merged in one chip, has been implemented. This development has advanced the move to achieve an increase in data transfer speed, space-saving (improvement in packaging density), and a reduction in power consumption.

For a system on chip incorporating therein a flash memory array, and a logic operational circuit, such as a microcomputer, for example, an external power supply of 3.3 V is used, which necessitates a plurality of MISFETs to be driven at the external power supply of 3.3 V, and a first internal power supply voltage of 1.8 V is generated by a voltage reduction circuit for lower power consumption and higher speed, which necessitates a plurality of MISFETs to be driven at the first internal power supply voltage. Further, a second internal power supply voltage of 10 V to 12 V is generated by a booster circuit, which necessitates a plurality of MISFETs to be driven at the second internal power supply voltage (10 to 12 V) for writing into selected memory cells in the flash memory array, or for other purposes. Hereinafter, the former MISFETs to be driven at a voltage of 3.3 V or 1.8 V are referred to as low breakdown voltage MISFETs. The latter MISFETs to be driven at 10 to 12 V are referred to as high breakdown voltage MISFETs. The low breakdown voltage MISFETs and the high breakdown voltage MISFETs are each incorporated in one semiconductor substrate (semiconductor chip) in the form of a CMOS (a pair consisting of a p-type MISFET and an n-type MISFET).

On the other hand, a system LSI to be mounted in a portable card is composed of a regulator, a CPU (Central Processing Unit), an input/out circuit (I/O), a system controller, a watch dog timer, a random-number generator, a ROM (Read Only Memory), a RAM (Random Access Memory), an EEPROM, and the like. In the regulator, the I/O circuit, and the EEPROM, a plurality of high breakdown voltage MISFETs are used. Whereas, in the watch dog timer and the timer in the EEPROM, a plurality of resistor elements are used. Further, a plurality of bypass capacitors are used for stabilizing the power supply voltage.

The present inventors have conducted a study on the system LSI, and, as a result, they have found the following problems.

The lower electrode of a capacitor element typically is formed of a first-layer polycrystal silicon film. Whereas, the upper electrode of the capacitor element and the gate electrodes of the low breakdown voltage and the high breakdown voltage MISFETs are formed of a second-layer polycrystal silicon film. In this case, the lower electrode is formed over an element isolation region of a principal surface of a substrate, and then a heat treatment is conducted to form a gate insulating film comprised of a silicon oxide film. During the formation of the gate insulating film, a bird's beak comprised of a silicon oxide film is formed so as to extend from the side of the lower electrode along the interface between the lower electrode and the element isolation region. The element isolation region of the principal surface of the substrate is generally formed of a silicon oxide film. An oxidant such as $O_2$ or $H_2O$ for the heat treatment passes through the silicon oxide film. Therefore, a bird's beak of a silicon oxide film extending from the side of the lower electrode along the interface between the lower electrode and the element isolation region is formed during the formation of the gate insulating film.

The edge of the lower electrode is lifted by the formation of the bird's beak, so that warping resulting in a convex bottom surface of the lower electrode is caused in the lower electrode. For this reason, the lower electrode becomes more likely to be peeled off from the element isolation region. Such a deficiency becomes more noticeable as the miniaturization of the capacitor element proceeds in association with the trend toward a high-integration and multifunction system LSI. This makes it difficult to achieve a reduction in the size of the capacitor element. Further, this also causes a reduction of the yield and a reduction of the reliability of the system LSI.

Also, in the case where a resistor element is formed of a first-layer polycrystal silicon film over the element isolation region of the substrate, and the gate electrodes of the low breakdown voltage and high breakdown voltage MISFETs are formed of a second-layer polycrystal silicon film, the bird's beak is formed. Variations in the resistance value of the resistor element are caused by the formation of the bird's beak. The variation in resistance value of the resistor element due to the bird's beak becomes noticeable with the miniaturization of the resistor element. This makes it difficult to achieve the formation of a high resistive resistor element with a narrowed width.

The channel length of the MISFET becomes shorter with advances of miniaturization due to the increase in scale of integration. The reduction in channel length causes the depletion layers from the source region and the drain region to extend under the gate electrode. This results in the reduction of the potential barrier of the channel formation region. As a result, the threshold value voltage (Vth) is reduced, so that only a little increase in voltage (Vds) between the source region/the drain region increases the drain current (Ids). This makes it impossible to obtain a constant current region. Further, an increase in the voltage Vds results in the punch through state, in which the depletion layers from the drain region and the source region come in contact with each other, leading to a rapid increase in the drain current Ids. Namely, the breakdown voltage between the drain region/the source region is reduced. Further, since the drain current (sub-threshold current) flowing with a gate voltage (Vg) lower than the threshold value voltage Vth increases, the leakage current in the OFF state increases.

Such degradation in breakdown voltage between the drain region/the source region and increase in leakage current in the OFF state can be suppressed by raising the impurity concentration of the well regions in which MISFETs are to be formed, i.e., the impurity concentration of the channel formation regions. Therefore, the surface impurity concentration of a low voltage system well region in which a low breakdown voltage MISFET is to be formed is set higher than the surface impurity concentration of a high voltage system well region in which a high breakdown voltage MISFET is to be formed.

The well regions are generally formed before the step of forming a gate insulating film. On the other hand, the gate insulating film of an ONO type nonvolatile storage element is generally formed by the thermal oxidation of the lower-layer and upper-layer oxide films. Therefore, in the case where the low voltage system well region is formed before the step of forming the gate insulating film of the ONO type nonvolatile storage element, the number of times the low voltage system well region is heat treated increases. The surface impurity concentration of the low voltage system well region is higher than the surface impurity concentration of the high voltage system well region. For this reason, an increase in the number of times the heat treatment is conducted results in a reduction of the surface impurity concentration of the low voltage system well region. Accordingly, the characteristics of the low breakdown voltage MISFET are changed.

It is an object of the present invention to provide a technique that is capable of implementing a capacitor element with a small occupying area and a large capacitance.

It is another object of the present invention to provide a technique that is capable of implementing a high resistive resistor element.

It is a still other object of the present invention to provide a technique that is capable of forming a high breakdown voltage MISFET without affecting the characteristics of a low breakdown voltage MISFET.

It is a still further object of the present invention to provide a technique that is capable of improving the yield in the manufacture of a semiconductor integrated circuit device.

The foregoing and other objects, and the novel features of the present invention will be apparent through the description provided in this specification and from the accompanying drawings.

Out of the various aspects of the invention disclosed in this application, the outlines of typical ones will be briefly described as follows.

(1) A semiconductor integrated circuit device, includes a semiconductor substrate having an element isolation region in a principal surface thereof; and a capacitor element having a lower electrode provided over the element isolation region of the principal surface of the semiconductor substrate, a dielectric film over the lower electrode, and an upper electrode provided over the lower electrode via the dielectric film interposed therebetween, wherein oxidation resistant films (e.g., silicon nitride films) are provided between the element isolation region of the principal surface of the semiconductor substrate and the lower electrode, and between the lower electrode and the upper electrode.

(2) A method of manufacturing a semiconductor integrated circuit device which has a MISFET including a gate electrode provided over an element formation region of a principal surface of a semiconductor substrate with a gate insulating film being interposed therebetween; and a capacitor element having a lower electrode provided over an element isolation region of the principal surface of the semiconductor substrate, and an upper electrode over the lower electrode with a dielectric film being interposed therebetween, the method comprising a step of conducting a heat treatment with the lower electrode being provided over the element isolation region of the principal surface of the semiconductor substrate with a first oxidation resistant film (e.g., a silicon nitride film) being interposed therebetween, and with the top surface of the lower electrode being covered with a second oxidation resistant film (e.g., a silicon nitride film) so as to form the gate insulating film comprised of a silicon oxide film in the element formation region of the principal surface of the semiconductor substrate.

(3) A method of manufacturing a semiconductor integrated circuit device which has a nonvolatile storage element formed in a first region of a principal surface of a semiconductor substrate; a MISFET formed in a second region of the principal surface of the semiconductor substrate; and a capacitor element formed over an element isolation region of the principal surface of the semiconductor substrate, the method comprising the steps of:

(a) conducting a heat treatment, and forming a silicon oxide film in the first region of the principal surface of the semiconductor substrate;

(b) after the step (a), forming a first silicon nitride film in such a manner as to cover the silicon oxide film and the element isolation region of the principal surface of the semiconductor substrate;

(c) after the step (b), forming a first silicon film over the first silicon nitride film in such a manner as to cover the first region of the principal surface of the semiconductor substrate and the element isolation region of the principal surface of the semiconductor substrate;

(d) after the step (c), forming a second silicon nitride film over the first silicon film in such a manner as to cover the element isolation region of the principal surface of the semiconductor substrate;

(e) after the step (d), patterning the second silicon nitride film and the first silicon film, and forming a gate electrode of the nonvolatile storage element over the first region of the principal surface of the semiconductor substrate and forming a lower electrode of the capacitor element, having its top surface covered with the second silicon nitride film, over the first silicon nitride film over the element isolation region of the principal surface of the semiconductor substrate;

(f) after the step (e), conducting a heat treatment, and forming a gate insulating film comprised of a silicon oxide film in the second region of the principal surface of the semiconductor substrate;

(g) after the step (f), forming a second silicon film in such a manner as to cover the gate insulating film and the second silicon nitride film over the lower electrode; and (h) after the step (g), patterning the second silicon film, and forming a gate electrode of the MISFET over the gate insulating film and forming an upper electrode of the capacitor element over the second silicon nitride film over the lower electrode.

(4) A semiconductor integrated circuit device, includes a semiconductor substrate having an element isolation region in a principal surface thereof; and a resistor element provided over the element isolation region of the principal surface of the semiconductor substrate, wherein oxidation resistant films (e.g., silicon nitride films) are provided between the element isolation region of the principal surface of the semiconductor substrate and the resistor element, and over the resistor element.

(5) A method of manufacturing a semiconductor integrated circuit device which has a MISFET including a gate electrode provided over an element formation region of a principal surface of a semiconductor substrate with a gate insulating film being interposed therebetween; and a resistor element provided over an element isolation region of the principal surface of the semiconductor substrate, the method comprising a step of conducting a heat treatment with the resistor element being provided over the element isolation region of the principal surface of the semiconductor substrate being a first oxidation resistant film (e.g., a silicon nitride film) being interposed therebetween, and with the top surface of the resistor element being covered with a second oxidation resistant film (e.g., a silicon nitride film) so as to form the gate insulating film comprised of a silicon oxide film in the element formation region of the principal surface of the semiconductor substrate.

(6) A method of manufacturing a semiconductor integrated circuit device which includes a nonvolatile storage element formed in a first region of a principal surface of a semiconductor substrate; a MISFET formed in a second region of the principal surface of the semiconductor substrate; and a resistor element formed over an element isolation region of the principal surface of the semiconductor substrate, the method comprising the steps of:

(a) conducting a heat treatment, and forming a silicon oxide film in the first region of the principal surface of the semiconductor substrate;

(b) after the step (a), forming a first silicon nitride film in such a manner as to cover the silicon oxide film and the element isolation region of the principal surface of the semiconductor substrate;

(c) after the step (b), forming a first silicon film over the first silicon nitride film in such a manner as to cover the first region of the principal surface of the semiconductor substrate and the element isolation region of the principal surface of the semiconductor substrate;

(d) after the step (c), forming a second silicon nitride film over the first silicon film in such a manner as to cover the element isolation region of the principal surface of the semiconductor substrate;

(e) after the step (d), patterning the second silicon nitride film and the first silicon film, and forming a gate electrode of the nonvolatile storage element over the first region of the principal surface of the semiconductor substrate and forming the resistor element, having its top surface covered with the second silicon nitride film over the first silicon nitride film, over the element isolation region of the principal surface of the semiconductor substrate;

(f) after the step (e), conducting a heat treatment, and forming a gate insulating film comprised of a silicon oxide film in the second region of the principal surface of the semiconductor substrate;

(g) after the step (f), forming a second silicon film in such a manner as to cover the gate insulating film; and (h) after the step (g), patterning the second silicon film, and forming a gate electrode of the MISFET over the gate insulating film.

(7) A method of manufacturing a semiconductor integrated circuit device which has a MISFET including a gate electrode provided over an element formation region of a principal surface of a semiconductor substrate with a gate insulating film being interposed therebetween; a capacitor element including a lower electrode provided over an element isolation region of the principal surface of the semiconductor substrate, and an upper electrode provided over the lower electrode with a dielectric film being interposed therebetween; and a resistor element provided over the element isolation region of the principal surface of the semiconductor substrate, the method comprising a step of conducting a heat treatment with the lower electrode and the resistor element being provided over the element isolation region of the principal surface of the semiconductor substrate with a first oxidation resistant film (e.g., a silicon nitride film) being interposed therebetween, and with the top surface of the lower electrode and the top surface of the resistor element being covered with a second oxidation resistant film (e.g., a silicon nitride film) so as to form the gate insulating film comprised of a silicon oxide film in the element formation region of the principal surface of the semiconductor substrate.

(8) A method of manufacturing a semiconductor integrated circuit device which has a nonvolatile storage element formed in a first region of a principal surface of a semiconductor substrate; a MISFET formed in a second region of the principal surface of the semiconductor substrate; a capacitor element formed over a first element isolation region of the principal surface of the semiconductor substrate; and a resistor element formed over a second element isolation region of the principal surface of the semiconductor substrate, the method comprising the steps of:

(a) conducting a heat treatment, and forming a silicon oxide film in the first region of the principal surface of the semiconductor substrate;

(b) after the step (a), forming a first silicon nitride film in such a manner as to cover the silicon oxide film and the first and second element isolation regions of the principal surface of the semiconductor substrate;

(c) after the step (b), forming a first silicon film over the first silicon nitride film in such a manner as to cover the first region of the principal surface of the semiconductor substrate and the first and second element isolation regions of the principal surface of the semiconductor substrate;

(d) after the step (c), forming a second silicon nitride film over the first silicon film in such a manner as to cover the first and second element isolation regions of the principal surface of the semiconductor substrate;

(e) after the step (d), patterning the second silicon nitride film and the first silicon film, and forming a gate electrode of the nonvolatile storage element over the first region of the principal surface of the semiconductor substrate, a lower electrode, of the capacitor element, having its top surface covered with the second silicon nitride film, over the first silicon nitride film over the first element isolation region of the principal surface of the semiconductor substrate, and the resistor element, having its top surface covered with the second silicon nitride film over the first silicon nitride film, over the second element isolation region of the principal surface of the semiconductor substrate;

(f) after the step (e), conducting a heat treatment, and forming a gate insulating film comprised of a silicon oxide film in the second region of the principal surface of the semiconductor substrate;

(g) after the step (f), forming a second silicon film in such a manner as to cover the second silicon nitride film over the lower electrode and the resistor element and the gate insulating film; and (h) after the step (g), patterning the second silicon film, and forming a gate electrode of the MISFET over the gate insulating film, and an upper electrode of the capacitor element over the second silicon nitride film over the lower electrode.

(9) A method of manufacturing a semiconductor integrated circuit device which has a nonvolatile storage element formed in a first region of a principal surface of a semiconductor substrate; a first MISFET provided in a second region of the principal surface of the semiconductor substrate; and a second MISFET having a lower operating voltage than that of the first MISFET, and provided in a third region of the principal surface of the semiconductor substrate; the method comprising the steps of:

forming a gate insulating film including a thermal oxide film in the first region of the principal surface of the semiconductor substrate;

forming a gate electrode over the gate insulating film;

forming a first well region in the second region of the principal surface of the semiconductor substrate; and forming a second well region in the third region of the principal surface of the semiconductor substrate, wherein the step of forming the second well region is carried out after forming the gate electrode.

DETAILED DESCRIPTION OF THE PREFERRED EMBODIMENTS

Figure 1:
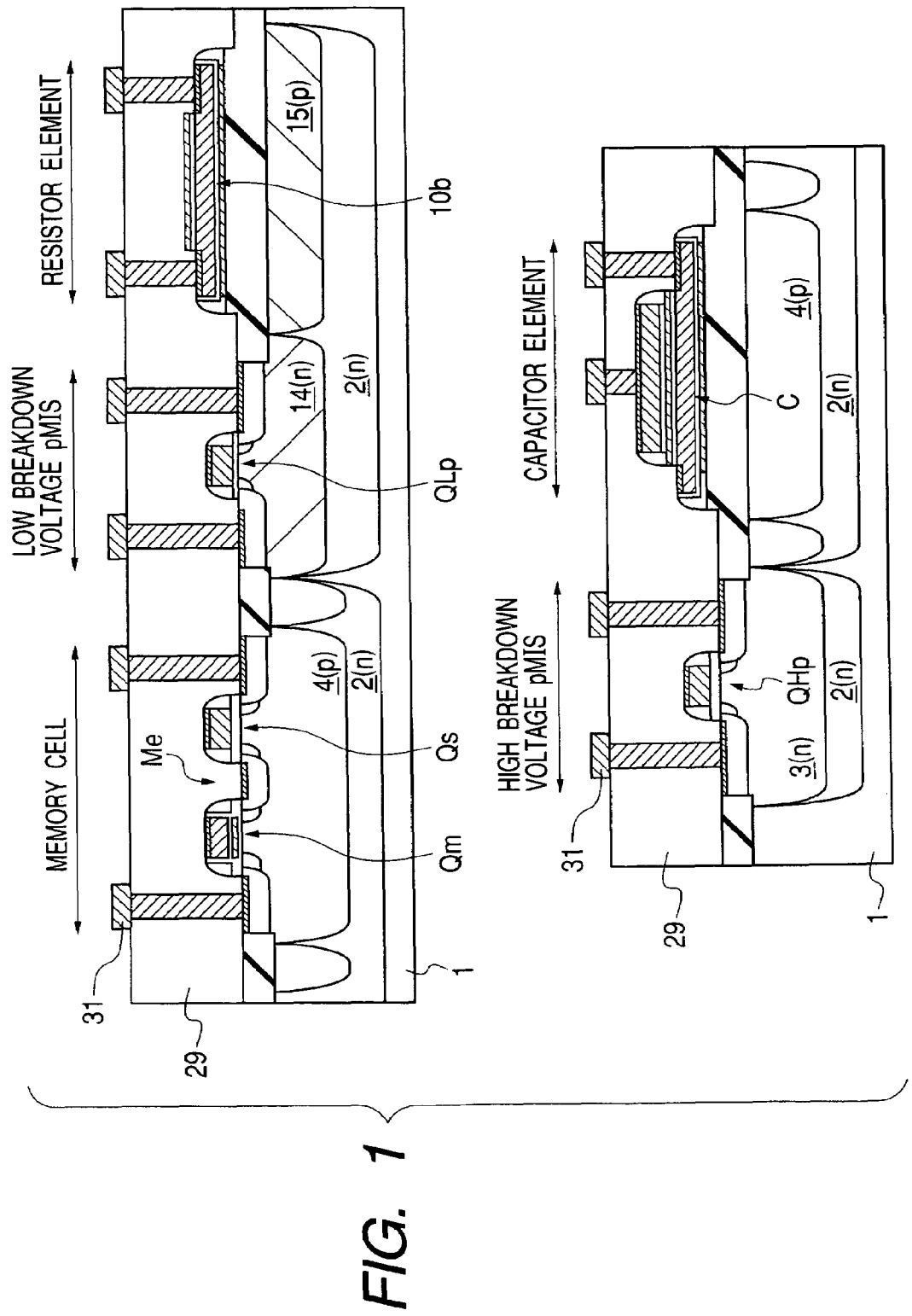
FIG. 1 is a schematic cross sectional view showing the general configuration of a semiconductor integrated circuit device representing one embodiment of the present invention.

The present invention will be described in detail by way of various embodiments with reference to the accompanying drawings. Incidentally, throughout the drawings, elements having the same function are represented by the same reference numerals and characters, and a repeated description thereof is omitted. Whereas, in cross sectional views, hatching indicating cross sections may be partially omitted for convenient reference of the drawings.

In this embodiment, the description will be directed by way of example to the case where the present invention is applied to a system LSI to be incorporated in, for example, an IC card, and used, as a semiconductor integrated circuit device.

Figure 5:
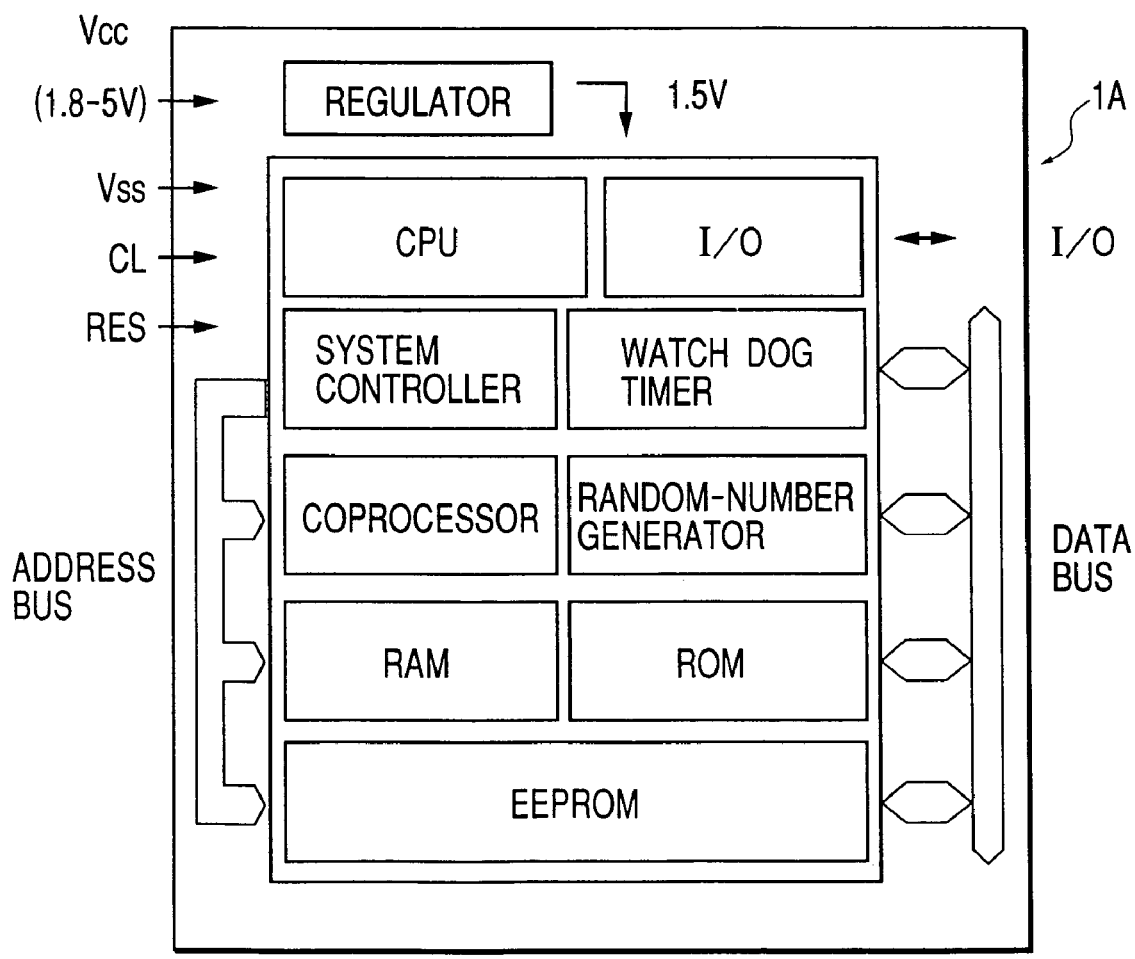
FIG. 5 is a block diagram showing the configuration of the semiconductor integrated circuit device according to one embodiment of the present invention.

As shown in FIG. 5, the system LSI of this embodiment is configured such that a regulator, a central processing unit (CPU), an input/output circuit (I/O), a system controller, a watch dog timer, a random-number generator, a ROM, a RAM, an EEPROM, and the like are mounted on a semiconductor chip 1A.

Figure 6:
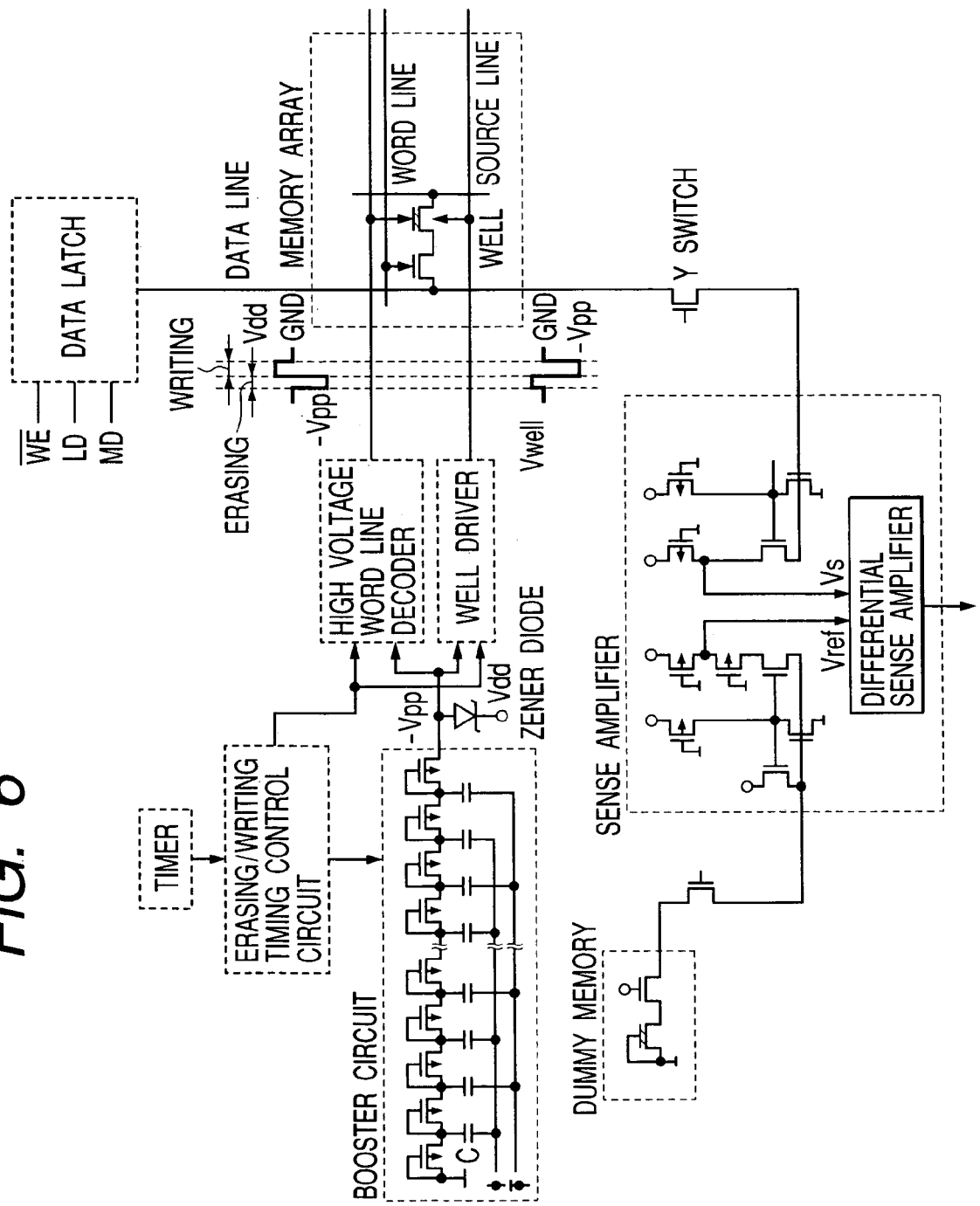
FIG. 6 is a schematic circuit diagram showing the general configuration of an EEPROM of FIG. 5.

The EEPROM constituting the system LSI is used as, for example, a data memory of an IC card, and it is configured to be supplied with a high voltage (−Vpp) for rewriting (erasing and writing) via a booster circuit, as shown in FIG. 6, mounted in the semiconductor chip 1A. The booster circuit boosts 1.5 V generated by stepping down the external power supply voltage of 1.8 to 5 V through a regulator for low voltage logics other than the EEPROM to generate −10.5 V.

At this step, it supplies a high voltage to an output node via a multistage charge pump circuit using several tens-pF capacitor elements.

Figure 7:
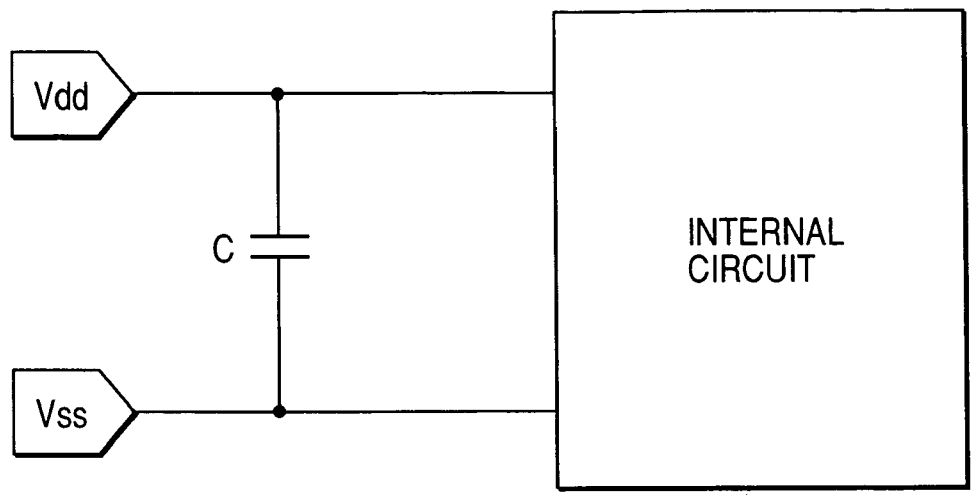
FIG. 7 is a schematic diagrammatic view of a bypass capacitor in FIG. 1.

Besides, in the semiconductor chip 1A, as shown in FIG. 7, a large number of capacitor elements C, referred to as bypass capacitors, are connected for stabilizing the internal power supply voltage between the internal power supply Vdd, that is generated by regulating the external power supply Vcc, and Vss (0V). The capacitor elements C are often located under wiring in a wiring channel region between respective circuit blocks (modules).

Incidentally, the system LSI is basically formed in a CMIS device configuration in which n-channel conductive type MISFETs and p-channel conductive type MISFETs are combined. The CMIS device is generally referred to as a CMOS.

Further, a MISFET to be driven at a relatively low voltage, such as a MISFET to be driven at 1.8 V or a MISFET to be driven at 3.3 V, is also miniaturized in device configuration for higher speed. Therefore, such a MISFET is also low in gate breakdown voltage. Hereinafter, such a MISFET is referred to as a low breakdown voltage MISFET. Whereas, a MISFET to be driven at a relatively high voltage, such as a MISFET to be driven at 12 V, is also high in gate breakdown voltage. Hereinafter, such a MISFET is referred to as a high breakdown voltage MISFET.

Now, a specific example of the configuration of the system LSI will be described with reference to FIGS. 1 to 4. FIG. 1 shows a memory cell Me, a low breakdown voltage p-type MISFET-QLp, a resistor element 10b, a high breakdown voltage p-MISFET-QHp, and a capacitor element C. The memory cell Me is used in the memory cell array of the EEPROM; the low breakdown voltage p-type MISFET-QLp is used in the CPU, or the like; the resistor element 10b is used in the watch dog timer, or the like; the high breakdown voltage p-type MISFET-QHp is used in the regulator, the I/O, the peripheral circuit of the EEPROM, or the like; and the capacitor element C is used as the bypass capacitor.

As shown in FIGS. 1 to 4, the system LSI is mainly composed of a semiconductor substrate 1 (hereinafter, simply referred to as a substrate) made of, for example, a p-type single crystal silicon. In a principal surface of the substrate 1, a plurality of element formation regions defined by element isolation regions 5 are provided. The element formation regions include a memory cell formation region, a low breakdown voltage MIS formation region, a high breakdown voltage MIS formation region, and the like. The element isolation regions 5 are formed by, for example, a known STI (Shallow Trench Isolation) technique. The element isolation regions 5 are formed by the STI technique are formed in the following manner. Shallow trenches (e.g., trenches with a depth of about 300 [nm]) are formed in the principal surface of the substrate 1. Then, an insulating film composed of, for example, a silicon oxide film is formed over the principal surface of the substrate 1 by a CVD (Chemical Vapor Deposition) process. Subsequently, planarization is carried out by a CMP (Chemical Mechanical Polishing) process so that the insulating film is selectively left inside the shallow trenches.

Figure 2:
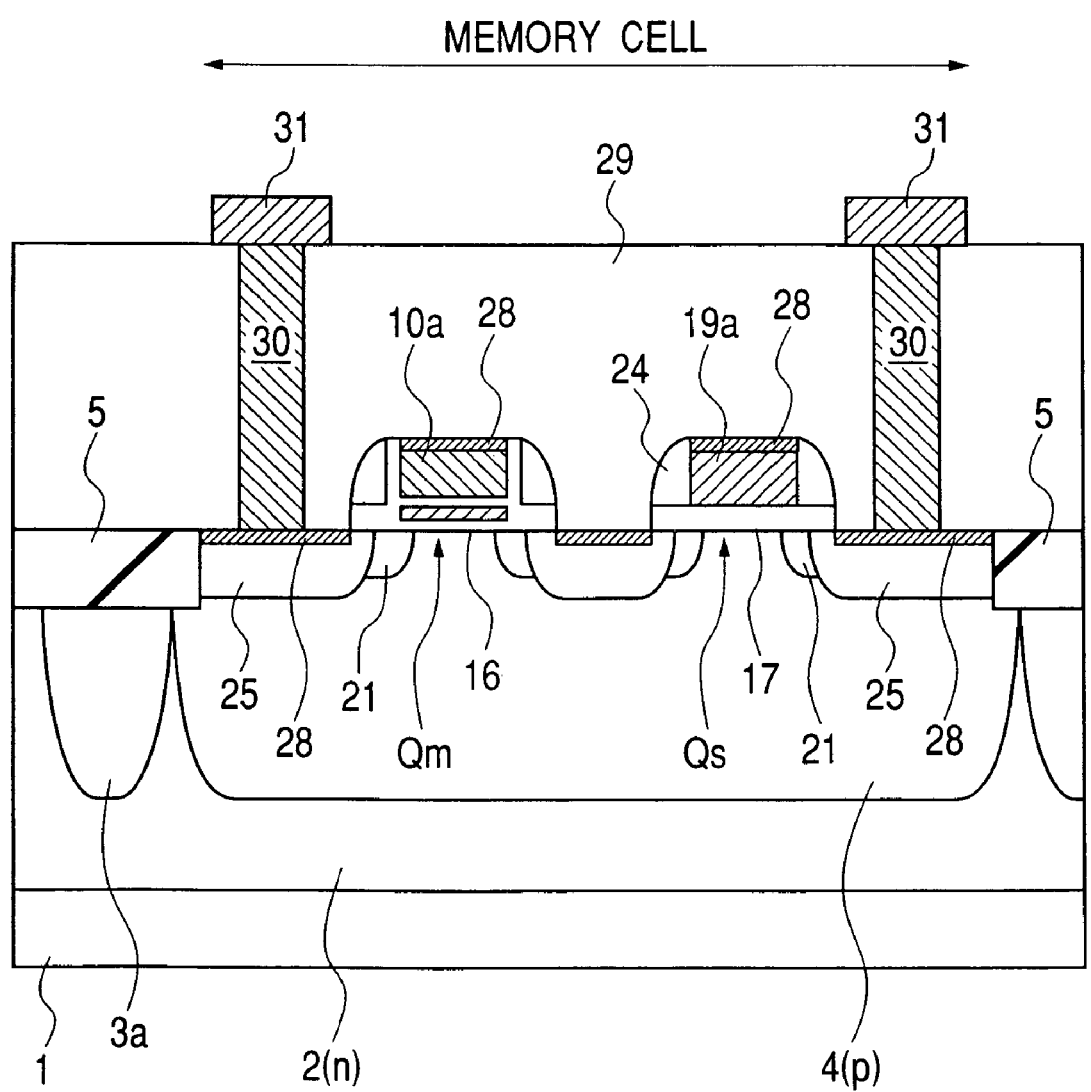
FIG. 2 is a schematic cross sectional view on an enlarged scale showing a part (a memory cell-part) of FIG. 1.

As shown in FIGS. 1 and 2, n-type well regions 2 are formed in the memory cell formation region of the principal surface of the substrate 1. In the n-type well regions 2, high voltage system p-type well regions 4 are formed. Further, in the memory cell formation region in the principal surface of the substrate 1, the memory cell Me is formed. The memory cell Me is composed of one nonvolatile storage element Qm, and one selecting MISFET-Qs connected in series to the nonvolatile storage element Qm.

Figure 3:
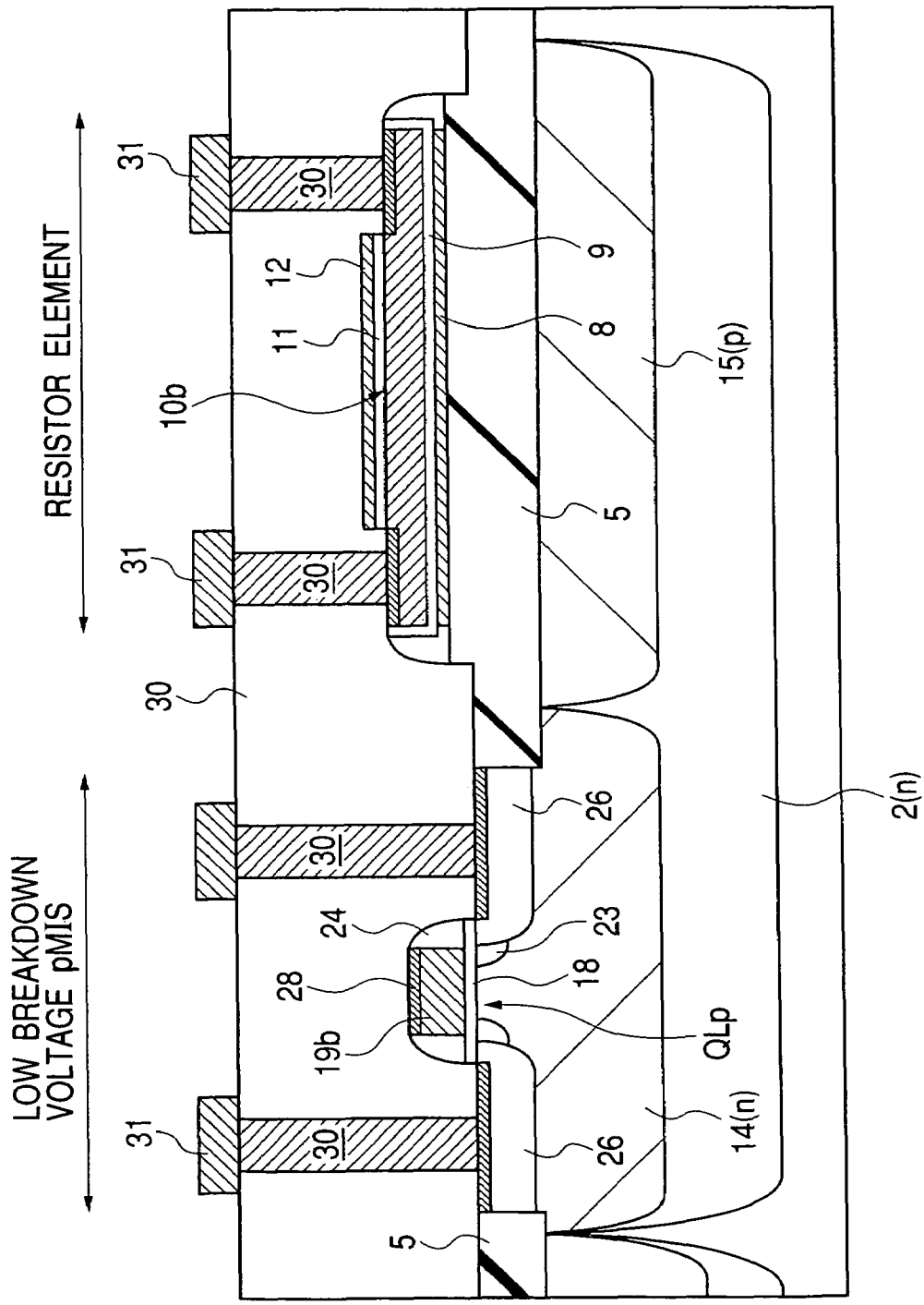
FIG. 3 is a schematic cross sectional view on an enlarged scale showing a part (a high breakdown voltage pMIS part and a resistor element part) of FIG. 1.

As shown in FIGS. 1 and 3, in a low voltage pMIS formation region in the principal surface of the substrate 1, an n-type well region 2 is formed. In the n-type well region 2, a low voltage system n-type well region 14 is formed. Further, in the low voltage pMIS formation region of the principal surface of the substrate 1, the low breakdown voltage p-type MISFET-QLp is formed.

As shown in FIGS. 1 and 3, over the element isolation region 5 of the principal surface of the substrate 1, the resistor element 10b is formed. Under the element isolation region 5, over which the resistor element 10b is formed, a low voltage system p-type well region 15 is formed. Hereinafter, the element isolation region 5, over which the resistor element 10b is formed, will be referred to as a first element isolation region.

As shown in FIGS. 1 to 4, in the high voltage pMIS formation region of the principal surface of the substrate 1, the n-type well region 2 is formed. In the n-type well region 2, a high voltage system n-type well region 3 is formed. Further, in the high voltage PMIS formation region in the substrate 1, the high breakdown voltage p-type MISFET-QHp is formed.

As shown in FIGS. 1 to 4, over the element isolation region 5 of the principal surface of the substrate 1, a capacitor element C is formed. Under the element isolation region 5, over which the capacitor element C is formed, a high voltage system p-type well region 4 is formed. Hereinafter, the element isolation region 5, over which the capacitor element C is formed, will be referred to as a second element isolation region.

Incidentally, for preventing a parasitic channel, n-type well regions 3a are formed between the high voltage system p-type well region 4 and the low voltage system n-type well region 14, between the high voltage system n-type well region 3 and the high voltage system p-type well region 4, and the like.

As shown in FIG. 2, the nonvolatile storage element Qm mainly comprises a channel formation region, a gate insulating film 16, a gate electrode (memory gate electrode) 10a, and a source region and a drain region. The gate insulating film 16 is provided in the principal surface of the substrate 1; the gate electrode 10a is provided over the principal surface of the substrate 1 with the gate insulating film 16 being interposed therebetween; and the channel formation region is provided in the surface layer portion of the substrate immediately under the gate electrode 10a, specifically, in the surface layer portion of the high voltage system p-type well region 4. The source region and the drain region are provided on opposite sides along the direction of channel length of the channel formation region in such a manner as to sandwich the channel formation region therebetween.

The source region and the drain region of the nonvolatile storage element Qm comprise a pair of n-type semiconductive regions 21 which are extension regions and a pair of n-type semiconductive regions 25 which are contact regions. The n-type semiconductive regions 21 are formed in alignment with the gate electrode 10a. The n-type semiconductive regions 25 are formed in alignment with a sidewall spacer 24 that is disposed on the sidewall of the gate electrode 10a, and they have a higher impurity concentration than that of the n-type semiconductive regions 21.

The nonvolatile storage element Qm is configured in the form of a MONOS (Metal Oxide Nitride Oxide Semiconductor) in which an ONO (oxide/nitride/oxide) film is used as the gate insulating film 16 between the high voltage system p-type well region 4 (substrate) and the gate electrode 10a, and information is stored in this gate insulating film 16. The nonvolatile storage element Qm of this embodiment uses an ONO film composed of silicon oxide film/silicon nitride film/silicon oxide film as the gate insulating film 16.

As shown in FIG. 2, the selecting MISFET-Qs mainly comprises a channel formation region, a gate insulating film 17, a gate electrode 19a, and a source region and a drain region. The gate insulating film 17 is provided in the principal surface of the substrate 1. The gate electrode 19a is disposed over the principal surface of the substrate 1 with the gate insulating film 17 being interposed therebetween; and the channel formation region is provided in the surface layer portion of the substrate immediately under the gate electrode 19a, specifically, in the surface layer portion of the high voltage system p-type well region 4. The source region and the drain region are provided on opposite sides along the direction of channel length of the channel formation region in such a manner as to sandwich the channel formation region therebetween.

The source region and the drain region of the selecting MISFET-Qs comprise a pair of n-type semiconductive regions 21 which are extension regions and a pair of n-type semiconductive regions 25 which are contact regions. The n-type semiconductive regions 21 are formed in alignment with the gate electrode 19a. The n-type semiconductive regions 25 are formed in alignment with a sidewall spacer 24 that is disposed on the sidewall of the gate electrode 19a.

The threshold value voltage of the nonvolatile storage element Qm is high if a large number of electrons are captured by the traps in the silicon nitride film of the gate insulating film 16. Accordingly, even if the electric potential of a word line integrally formed with the gate electrode 10a becomes high, the transistor will not go into the ON state. If electrons vanish from the traps in the silicon nitride film of the gate insulating film 16, the threshold value voltage is reduced, so that the transistor goes into the ON state. Injection of electrons into the silicon nitride film of the gate insulating film 16 (writing) is accomplished in the following manner. A positive voltage (e.g., 1.5 V) is applied to the gate electrode 10a, and a negative high voltage (e.g., −10.5 V) is applied to the high voltage system p-type well region 4. Thus, tunneling is caused from the channel formation region (high voltage system p-type well region 4) through the silicon oxide film of the gate insulating film 16. Conversely, for erasing, a negative high voltage (e.g., −8.5 V) is applied to the gate electrode 10a, and a positive voltage (e.g., 1.5 V) is applied to the high voltage system p-type well region 4. Thus, the electrons in the silicon nitride film of the gate insulating film 16 are emitted into the channel formation region (high voltage system p-type well region 4) by the tunneling effect, and positive holes are tunnel injected from the channel formation region into the silicon nitride film.

As shown in FIG. 3, the low breakdown voltage p-type MISFET-QLp mainly comprises a channel formation region, a gate insulating film 18, a gate electrode 19b, and a source region and a drain region. The gate insulating film 18 is provided in the principal surface of the substrate 1; the gate electrode 19b is provided over the principal surface of the substrate 1 with the gate insulating film 18 being interposed therebetween; and the channel formation region is provided in the surface layer portion of the substrate immediately under the gate electrode 19b, specifically, in the surface layer portion of the low voltage system n-type well region 14. The source region and the drain region are provided on opposite sides along the direction of channel length of the channel formation region in such a manner as to sandwich the channel formation region therebetween.

The source region and the drain region of the low breakdown voltage p-type MISFET-QLp comprises a pair of p-type semiconductive regions 23 which are extension regions, and a pair of p-type semiconductive regions 26 which are contact regions. The p-type semiconductive regions 23 are formed in alignment with the gate electrode 19b. The p-type semiconductive regions 26 are formed in alignment with a sidewall spacer 24 that are disposed on the sidewall of the gate electrode 19b, and they have a higher impurity concentration than that of the n-type semiconductive regions 23.

As shown in FIG. 3, the resistor element 10b includes contact regions for establishing connection to an upper-layer wiring, respectively provided on the one edge and the other edge positioned on mutually opposite sides. The resistor element 10b is mainly composed of, for example, a polycrystal silicon film.

Figure 4:
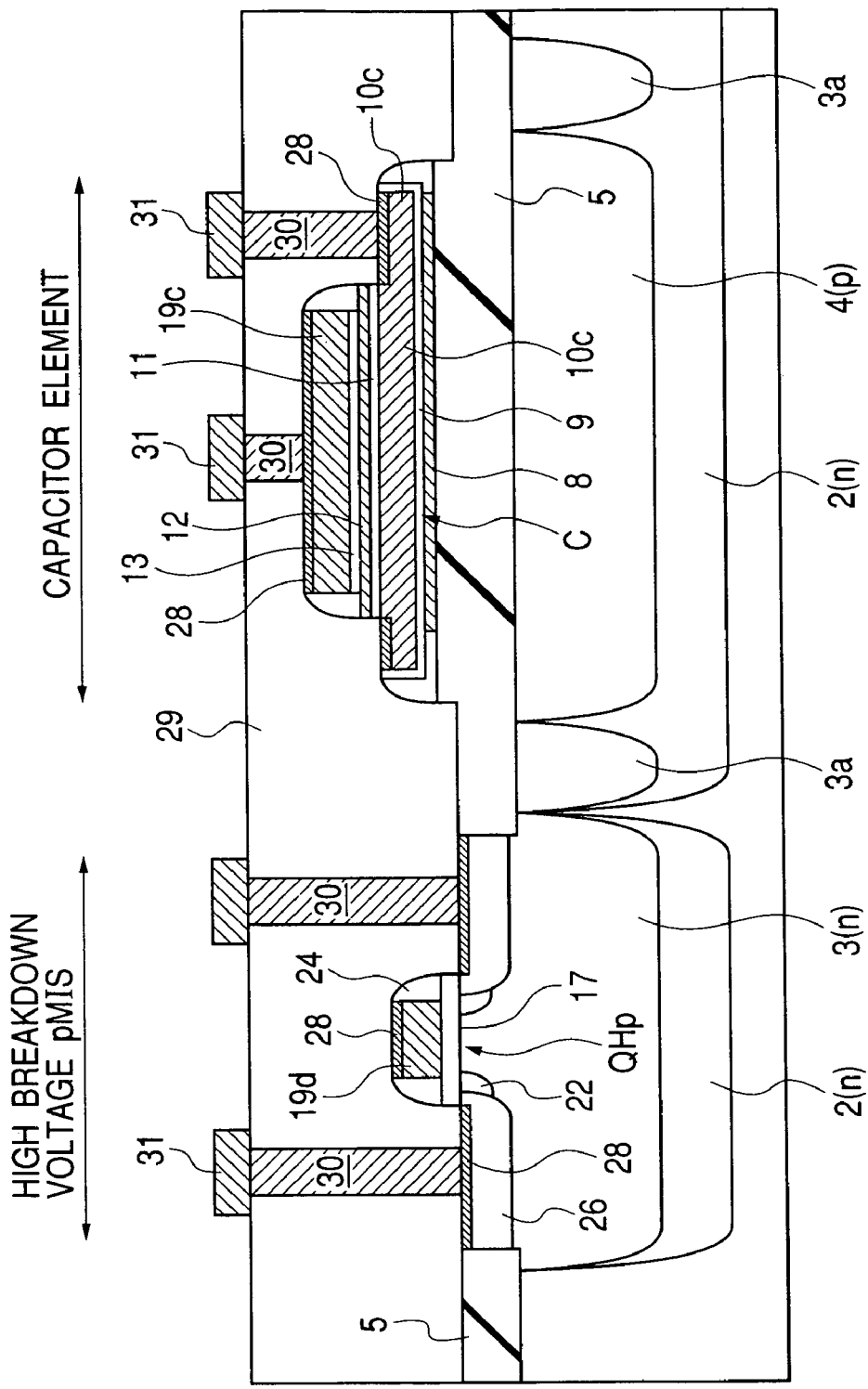
FIG. 4 is a schematic cross sectional view on an enlarged scale showing a part (a low breakdown voltage pMIS part and a capacitor element part) of FIG. 1.

As shown in FIG. 4, the high breakdown voltage p-type MISFET-QHp mainly comprises a channel formation region, a gate insulating film 17, a gate electrode 19d, and a source region and a drain region. The gate insulating film 17 is provided in the principal surface of the substrate 1; the gate electrode 19d is provided over the principal surface of the substrate 1 with the gate insulating film 17 being interposed therebetween; and the channel formation region is provided in the surface layer portion of the substrate immediately under the gate electrode 19d, specifically, in the surface layer portion of the high voltage system n-type well region 3. The source region and the drain region are provided on opposite sides along the direction of channel length of the channel formation region in such a manner as to sandwich the channel formation region therebetween.

The source region and the drain region of the high breakdown voltage p-type MISFET-QHp comprises a pair of p-type semiconductive regions 22 which are extension regions, and a pair of p-type semiconductive regions 26 which are contact regions. The p-type semiconductive regions 22 are formed in alignment with the gate electrode 19d. The p-type semiconductive regions 26 are formed in alignment with a sidewall spacer 24 that is disposed on the sidewall of the gate electrode 19d, and they have a higher impurity concentration than that of the p-type semiconductive regions 22.

As shown in FIG. 4, the capacitor element C comprises a lower electrode 10c provided over the second element isolation region of the principal surface of the substrate 1, and an upper electrode 19c provided over the lower electrode 10c with a dielectric film being interposed therebetween. The capacitor element C of this embodiment uses an ONO film composed of silicon oxide film 11/silicon nitride film 12/silicon oxide film 13 as the dielectric film. The high voltage system p-type well region 4 under the second element isolation region is fixed at a given electric potential (e.g., 0V) so that the capacitor element C is not affected thereby.

The gate electrode 10a of the nonvolatile storage element Qm, the resistor element 10b, and the lower electrode 10c of the capacitor element C are mainly formed of, for example, a first-layer polycrystal silicon film. The gate electrode 19a of the selecting MISFET-Qs, the gate electrode 19b of the low breakdown voltage p-type MISFET-QLp, the upper electrode 19c of the capacitor element C, and the gate electrode 19d of the high breakdown voltage p-type MISFET-QHp are mainly formed of, for example, a second-layer polycrystal silicon film. To these first-layer and second-layer polycrystal silicon films, impurities for reducing the resistance value have been doped.

In the gate insulating film 16 of the nonvolatile storage element Qm, the lower-layer silicon oxide film has a thickness of, for example, about 1.8 [nm]; the silicon nitride film has a thickness of, for example, about 15 [nm]; and the upper-layer silicon oxide film has a thickness of, for example, about 3 [nm]. These upper-layer and lower-layer silicon oxide films are formed by, for example, a thermal oxidation process.

The gate insulating film 17 of the selecting MISFET-Qs and the high breakdown voltage p-type MISFET-QHp is formed with a thickness of, for example, about 18 [nm]; and the gate insulating film 17 of the low breakdown voltage p-type MISFET-QLp is formed with a thickness of, for example, about 3.7 [nm]. These gate insulating films 16 and 17 are formed by, for example, a thermal oxidation process.

The gate length of the nonvolatile storage element Qm is, for example, about 500 [nm]; the gate length of the selecting MISFET-Qs is, for example, about 400 [nm]; the gate length of the low breakdown voltage p-type MISFET-QLp is, for example, about 160 [nm]; and the gate length of the high breakdown voltage p-type MISFET-QHp is, for example, about 900 [nm].

As shown in FIGS. 2, 3, and 4, in the nonvolatile storage element Qm, the selecting MISFET-Qs, the low breakdown voltage p-type MISFET-QLp, the high breakdown voltage p-type MISFET-QHp, the capacitor element C, and the resistor element 10b, a silicide layer 28, which is a metal/semiconductor reaction layer, is formed for achieving the reduction in resistance over the surfaces of the gate electrodes (10a, 19a, 19b, and 19d), the surfaces of the semiconductor regions (25 and 26), the surface of the upper electrode 19c, the surface of the contact region of the lower electrode 10c, and the surfaces of the two contact regions positioned on mutually opposite sides of the resistor elements 10b. Each portion of the silicide layer 28 is formed in alignment with the sidewall spacer 24 by, for example, a salicide (self aligned silicide) technique.

Over the principal surface of the substrate 1, an interlayer insulating film 29, which is composed of, for example, a silicon oxide film, is provided in such a manner as to cover the foregoing active elements and passive elements. Over the semiconductive regions 25 and 26, contact holes for the sources/the drains, which reach from the surface of the interlayer insulating film 29 to the silicide layer 28, are provided. Conductive plugs 30 are embedded inside the contact holes for the sources/the drains. The semiconductive regions 25 and 26 are electrically connected to a wiring 31 extending over the interlayer insulating film 29 via the silicide layer 28 and the conductive plugs 30.

On the gate electrodes 19a, 19b, and 19d, although not shown, contact holes for the gates reaching from the surface of the interlayer insulating film 29 to the silicide layer 28 are provided. The conductive plugs 30 are embedded inside the contact holes for the gates. The gate electrodes 19a, 19b, and 19d are electrically connected to the wiring 31 extending over the interlayer insulating film 29 via the silicide layer 28 and the conductive plugs 30.

On the upper electrode 19c, a contact hole for the upper electrode reaching from the surface of the interlayer insulating film 29 to the silicide layer 28 is provided. The conductive plug 30 is embedded inside the contact hole for the upper electrode. The upper electrode 19c is electrically connected to the wiring 31 extending over the interlayer insulating film 29 via the silicide layer 28 and the conductive plug 30 interposed therebetween.

On the contact region of the lower electrode 10c, a contact hole for the lower electrode reaching from the surface of the interlayer insulating film 29 to the silicide layer 28 is provided. A conductive plug 30 is embedded inside the contact hole for the lower electrode. The lower electrode 10c is electrically connected to the wiring 31 extending over the interlayer insulating film 29 via the silicide layer 28 and the conductive plug 30 interposed therebetween.

On the one and the other contact regions of the resistor element 10b, contact holes for the resistor reaching from the surface of the interlayer insulating film 29 to the silicide layer 28 are respectively provided. Conductive plugs 30 are embedded inside the contact holes for the resistor. The one and the other contact regions of the resistor element 10b are electrically connected to the wiring 31 extending over the interlayer insulating film 29 via the silicide layer 28 and the conductive plugs 30 interposed therebetween.

As shown in FIG. 4, for example, a silicon nitride film 8 is provided as an oxidation resistant film between the lower electrode 10c of the capacitor element C and the second element isolation region (element isolation insulating film) of the principal surface of the substrate 1. Between the silicon nitride film 8 and the lower electrode 10c, for example, a silicon oxide film 9 is provided. Namely, the lower electrode 10c of the capacitor element C is provided over the second element isolation region of the principal surface of the substrate 1 with the oxidation resistant film composed of the silicon nitride film 8 being interposed therebetween. In this embodiment, the silicon nitride film 8 is formed by the same process as that used for the silicon nitride film of the gate insulating film 16 of the nonvolatile storage element Qm. The silicon oxide film 9 is formed by the same process as that used for the upper-layer silicon oxide film of the gate insulating film 16 of the nonvolatile storage element Qm.

In the capacitor element C, as shown in FIG. 4, the lower electrode 10c is formed with a larger planar size than that of the upper electrode 19c. This is for convenience of connection of the upper-layer wiring to the lower electrode 10c. Therefore, a contact region for establishing a connection to the upper-layer wiring is provided in the lower electrode 10c. Whereas, the area occupied by the capacitor element C is determined by the planar size of the lower electrode 10c.

The dielectric film of the capacitor element C is, as described above, formed of an ONO film composed of silicon oxide film 11/silicon nitride film 12/silicon oxide film 13. Therefore, an oxidation resistant film composed of the silicon nitride film 12 is provided between the lower electrode 10c and the upper electrode 19c.

The silicon nitride film 8 has a thickness of, for example, about 15 [nm]; the silicon oxide film 9 has a thickness of, for example, about 3 [nm]; the silicon oxide film 11 has a thickness of, for example, about 6 [nm]; the silicon nitride film 12 has a thickness of, for example, about 26 [nm]; and the silicon oxide film 13 has a thickness of, for example, about 1 [nm]. The capacitance per unit area in this case is about 1.9 [fF/$\mu m^2$], and 19 [pF] for 100 [$\mu m$] square.

Figure 8:
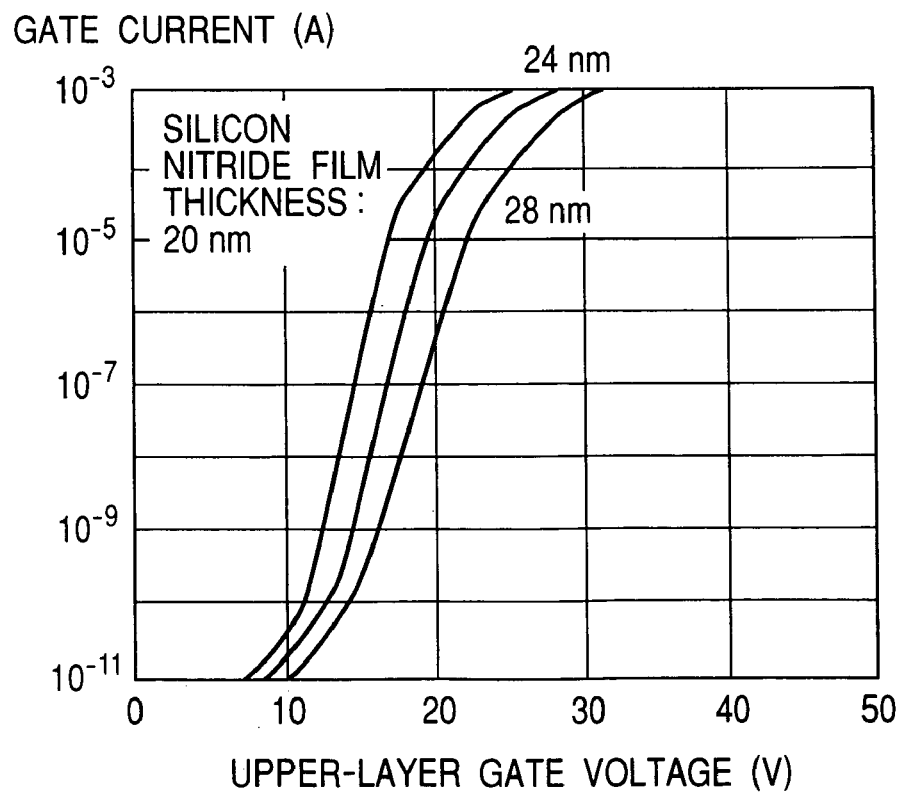
FIG. 8 is a graph showing the leakage current characteristics when a positive voltage is applied to an upper electrode in a capacitor element according to one embodiment of the present invention.

It is desirable that the leakage current flowing through the dielectric film of the capacitor element C is sufficiently small. FIG. 8 is a graph for showing the leakage current characteristics when a positive voltage is applied to the upper electrode in the capacitor element C in which the area of the dielectric film between the upper electrode and the lower electrode is 18000 [$\mu m^2$]. The thickness of the silicon nitride film 12 is taken as a parameter. As shown in FIG. 8, the leakage current decreases with an increase in thickness of the silicon nitride film 12, and the leakage current becomes remarkable from about 10 [V].

Figure 9:
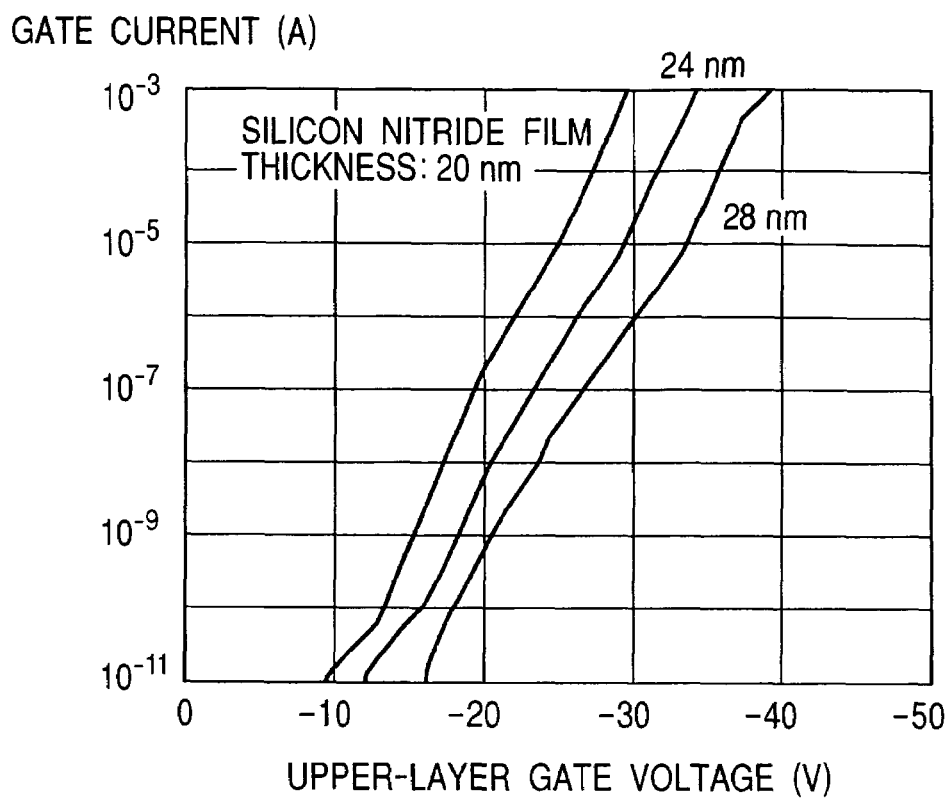
FIG. 9 is a graph showing the leakage current characteristics when a negative voltage is applied to the upper electrode in the capacitor element one embodiment of the present invention.

FIG. 9 is a graph showing the leakage current characteristics when a negative voltage is applied to the upper electrode in the capacitor element C having the same area as that of FIG. 8. The silicon nitride film 12 is taken as a parameter. As shown in FIG. 9, when the thickness of the silicon nitride film 12 is 26 [nm], the leakage current hardly flows until −14 [V]. Since the absolute voltage of the high voltage for the EEPROM of FIGS. 5 and 6 is 12 [V], the upper electrode is desirably held at a negative voltage, and thus is used. When it is used as a bypass capacitor for stabilizing the power supply, either polarity is acceptable. The leakage current has a polarity dependence because of the asymmetry resulting from the fact that the thickness of the silicon oxide film 11 is 6 [nm], and the thickness of the silicon oxide film 13 is 1 [nm].

Figure 10:
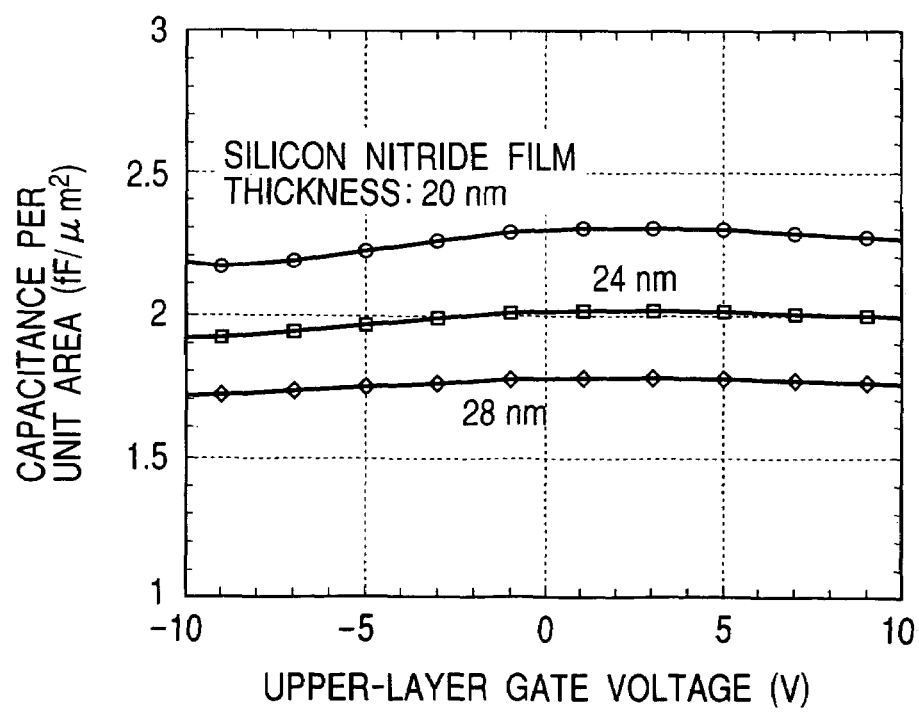
FIG. 10 is a graph showing the upper electrode voltage dependency of the capacitor element of one embodiment of the present invention.

FIG. 10 is a graph showing the upper electrode voltage dependency of the capacitor element C. As shown in FIG. 10, the capacitance value decreases on the negative voltage side because the lower electrode is depleted. The smaller the thickness of the silicon nitride film 12 is, the more the capacitance value decreases on the negative voltage side. This is also because the lower electrode is more susceptible to depletion. As compared with a MOS type capacitor element in which a semiconductive region formed in a substrate serves as a lower electrode, the capacitor element C is characterized by its very small applied voltage dependency.

As shown in FIG. 3, for example, the silicon nitride film 8 is provided as the oxidation resistant film between the resistor element 10b and the first element isolation region of the principal surface of the substrate 1. Between the silicon nitride film 8 and the resistor element 10b, for example, the silicon oxide film 9 is provided. Namely, the resistor element 10b is provided over the first element isolation region of the principal surface of the substrate 1 with the oxidation resistant film composed of the silicon nitride film 8 being interposed therebetween. In this embodiment, the silicon nitride film 8 is formed by the same process as that used for the silicon nitride film of the gate insulating film 16 of the nonvolatile storage element Qm. The silicon oxide film 9 is formed by the same process as that used for the upper-layer silicon oxide film of the gate insulating film 16 of the nonvolatile storage element Qm.

As shown in FIGS. 1 to 4, the low voltage system n-type well region 14 is formed with a shallower depth than that of the high voltage system n-type well region 3. The surface concentration of the low voltage system n-type well region 14 is higher (more dense) than the surface concentration of the high voltage system n-type well region 3. The low voltage system p-type well region 15 is formed with a shallower depth than that of the high voltage system p-type well region 4. The surface concentration of the low voltage system p-type well region 15 is higher (more dense) than the surface concentration of the high voltage system p-type well region 4.

Now, a method of manufacture of a semiconductor integrated circuit device according to this embodiment will be described by reference to FIGS. 12 to 28. FIGS. 12 to 28 are schematic cross sectional diagrams of the semiconductor integrated circuit device in respective manufacturing steps.

Figure 12:
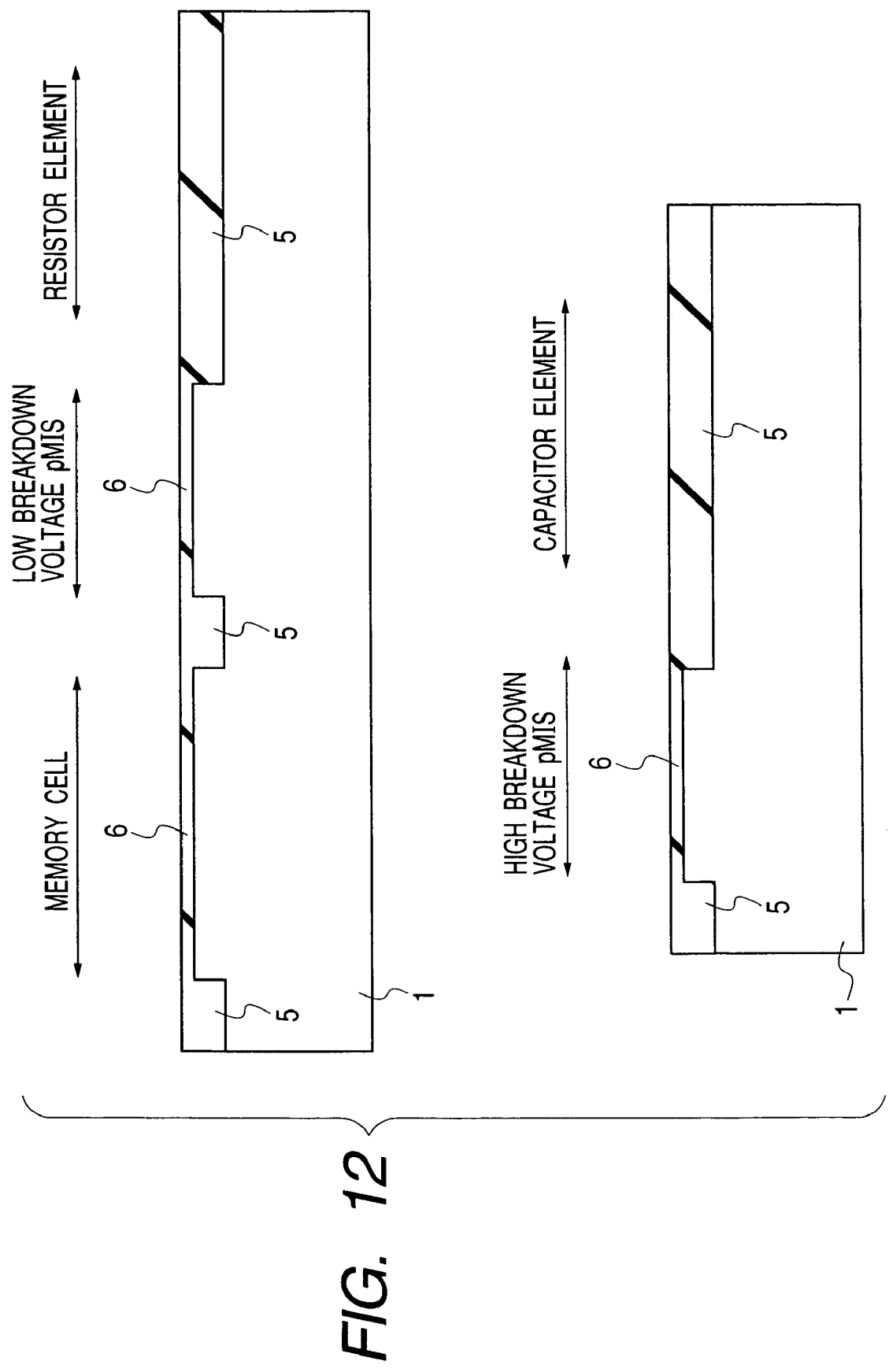
FIG. 12 is a schematic cross sectional view of the semiconductor integrated circuit device during a manufacturing step, according to one embodiment of the present invention.

First, the substrate 1 composed of single crystal silicon having a specific resistance of 10 [Ωcm] is prepared. Thereafter, as shown in FIG. 12, the element isolation regions 5 defining the element formation regions are formed in the principal surface of the substrate 1. The element isolation regions 5 are formed using, for example, a known STI technique. Specifically, the element isolation regions 5 are formed in the following manner. Shallow trenches (trenches with a depth of, for example, about 300 [nm]) are formed in the principal surface of the substrate 1. Subsequently, an insulating film composed of, for example, silicon oxide, is formed over the principal surface of the substrate 1 by a CVD process. Then, planarization is carried out by a CMP process so that the insulating film is selectively left inside the shallow trenches. In this step, a buffer insulating film 6 composed of, for example, a silicon oxide film is formed in the element formation regions of the principal surface of the substrate 1.

Figure 13:
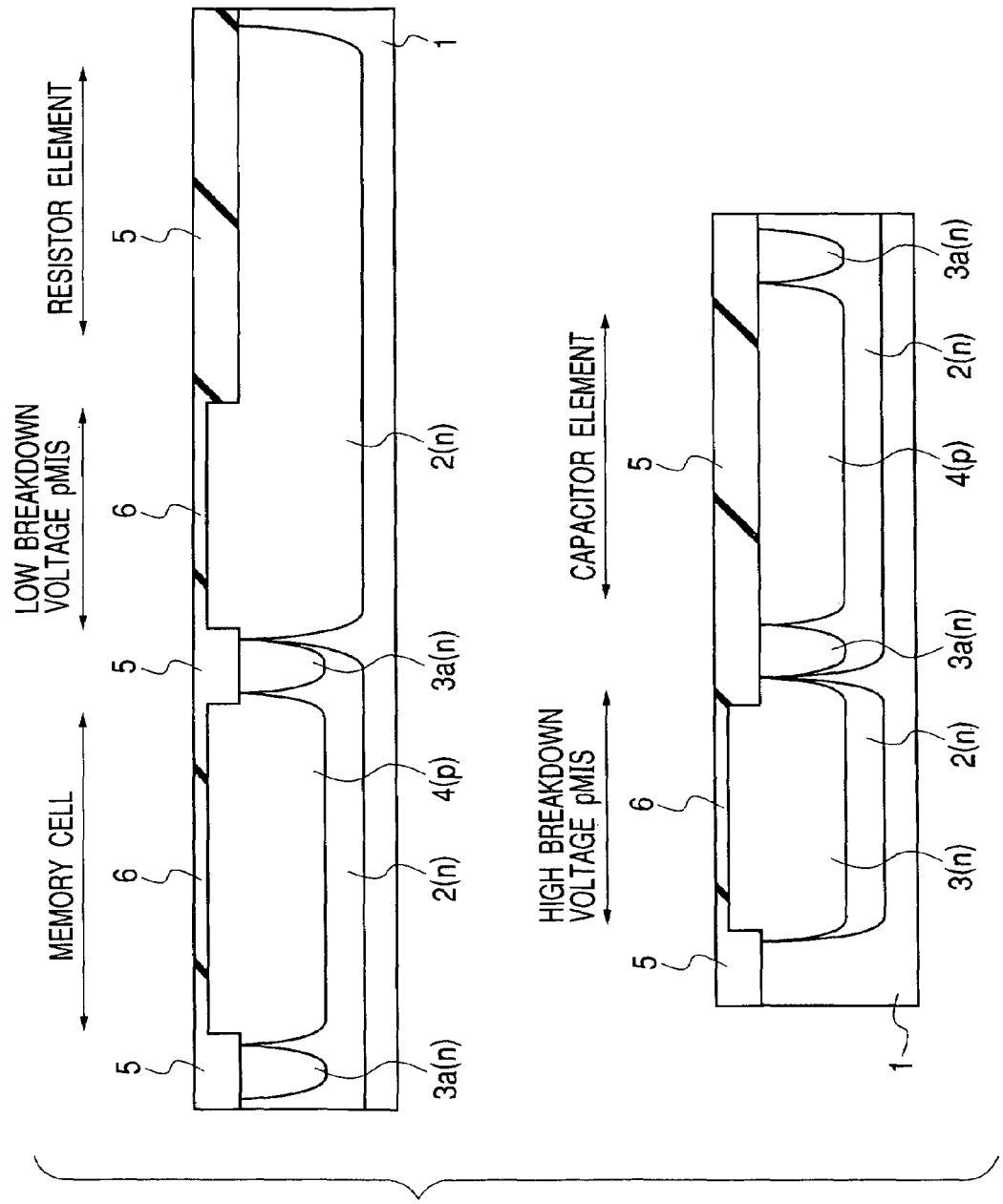
FIG. 13 is a schematic cross sectional view showing the semiconductor integrated circuit device during a manufacturing step subsequent to that shown in FIG. 12.

Then, an impurity for forming well regions is selectively ion-implanted into the principal surface of the substrate 1. Subsequently, a heat treatment for activating the impurity is carried out. As shown in FIG. 13, this results in the formation of the n-type well regions 2, the high voltage system n-type well regions 3, the n-type well regions 3a for preventing the parasitic channel, and the high voltage type p-type well regions 4.

As the impurity for forming the n-type well regions 2, for example, phosphorus (P) is used. The phosphorus is ion-implanted under the conditions of an accelerating energy of 2 MeV and a dose amount of $5.0 \times 10^{12}$ [atoms/cm$^2$].

As the impurities for forming the high voltage system n-type well regions 3, for example, phosphorus (P) and boron difluoride (BF$_2$) are used.

The ion implantation of phosphorus is carried out under the conditions as follows:

The accelerating energy is 1 MeV, and the dose amount is $8.0 \times 10^{12}$ [atoms/cm$^2$];

The accelerating energy is 460 KeV, and the dose amount is $5.0 \times 10^{11}$ [atoms/cm$^2$]; or The accelerating energy is 180 KeV, and the dose amount is $1.0 \times 10^{12}$ [atoms/cm$^2$].

Whereas, the ion implantation of boron difluoride is carried out under the conditions of an energy of 100 KeV and a dose amount of $1.5 \times 10^{12}$ [atoms/cm$^2$].

As the impurities for forming the high voltage system p-type well regions 4, for example, boron (B) and boron difluoride (BF$_2$) are used.

The ion implantation of boron is carried out under the conditions as follows:

The accelerating energy is 500 KeV, and the dose amount is $8.0 \times 10^{12}$ [atoMs/cm$^2$];

The accelerating energy is 150 KeV, and the dose amount is $1.8 \times 10^{12}$ [atoms/cm$^2$]; or The accelerating energy is 50 KeV, and the dose amount is $1.2 \times 10^{12}$ [atoms/cm$^2$].

Whereas, the ion implantation of boron difluoride is carried out under the conditions of an accelerating energy of 100 KeV and a dose amount of $2.5 \times 10^{12}$ [atoms/cm$^2$].

The boron difluoride for forming the high voltage system n-type and p-type well regions is implanted for controlling the threshold value voltage.

In this step, the n-type well regions 2 and the high voltage system p-type well regions 4 are formed in the memory cell formation region of the principal surface of the substrate 1. Further, the n-type well regions 2 are formed under the low breakdown voltage PMIS formation region and the first element isolation region of the principal surface of the substrate 1. Whereas, the n-type well region 2 and the high voltage system n-type well region 3 are formed in the high breakdown voltage PMIS formation region of the principal surface of the substrate 1. Whereas, the n-type well region 2, and the high voltage system p-type well region 4 are formed under the second element isolation region of the principal surface of the substrate 1. Further, the n-type well regions 3a for preventing the parasitic channel are formed in the principal surface of the substrate 1.

Figure 14:
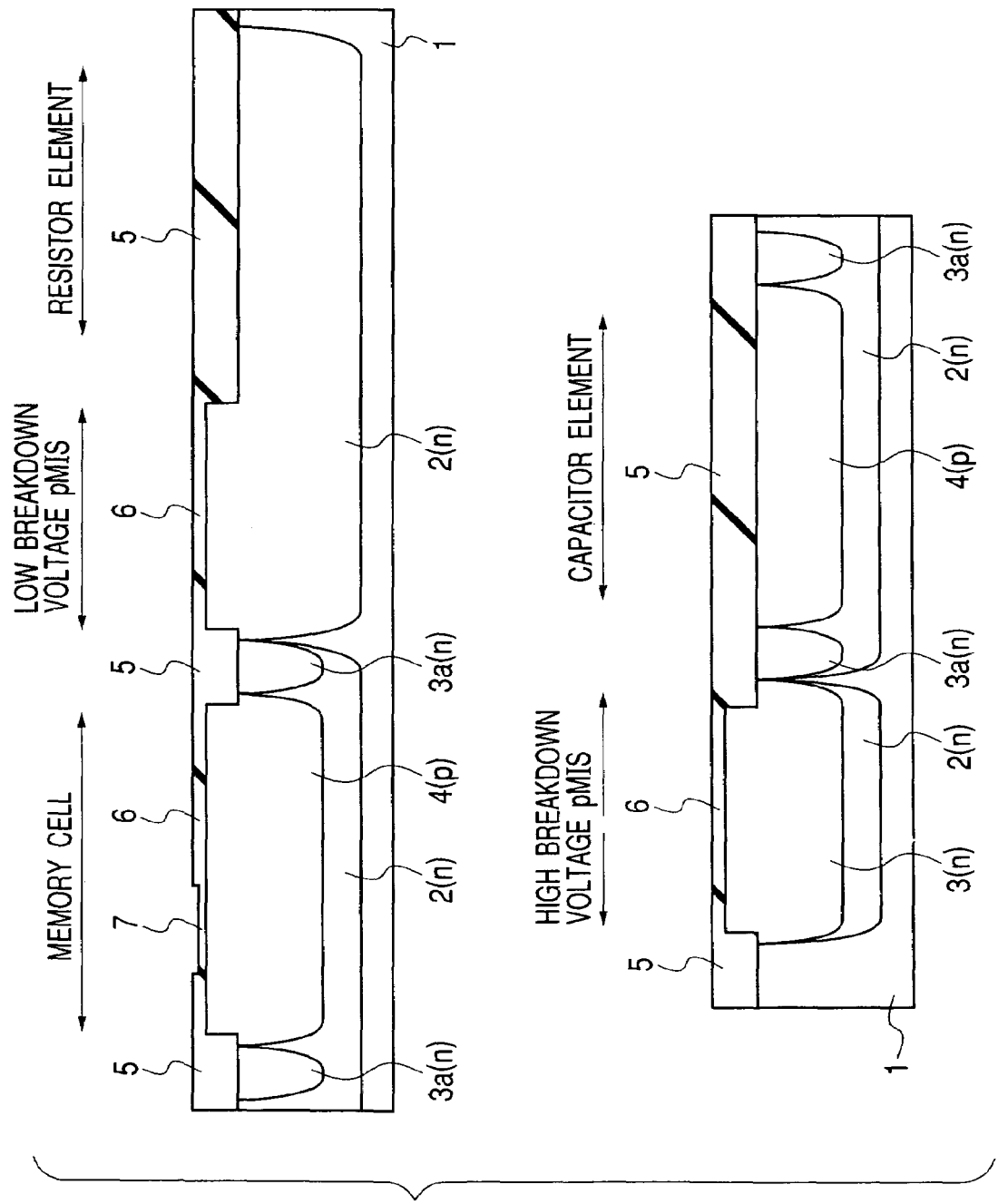
FIG. 14 is a schematic cross sectional view showing the semiconductor integrated circuit device during a manufacturing step subsequent to that of FIG. 13.

Then, a portion (a region where a nonvolatile storage element is to be formed) of the buffer insulating film 6 in the memory cell formation region of the principal surface of the substrate 1 is selectively removed by etching. Thereafter, the substrate 1 is subjected to a heat treatment in an oxygen atmosphere diluted with nitrogen. As shown in FIG. 14, this results in the formation of a silicon oxide film 7 with a thickness as very thin as, for example, about 1.8 [nm] in the nonvolatile storage element formation region formed by removing a portion of the buffer insulating film 6.

Figure 15:
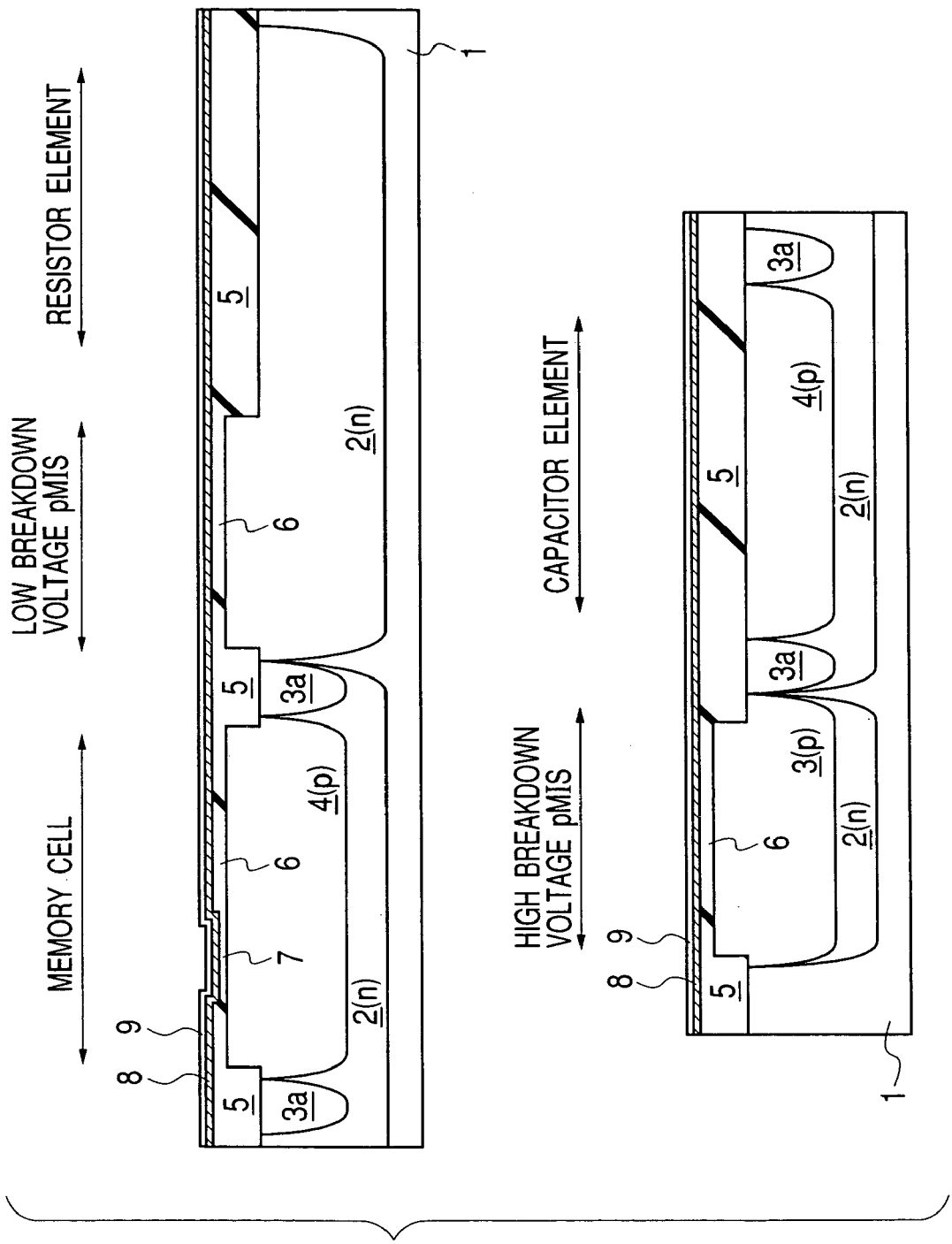
FIG. 15 is a schematic cross sectional view showing the semiconductor integrated circuit device during a manufacturing step subsequent to that shown in FIG. 14.

Then, as shown in FIG. 15, the silicon nitride film 8 with a thickness of, for example, about 18 [nm] is formed entirely over the principal surface of the substrate 1, including over the silicon oxide film 7 and over the first and second element isolation regions by a CVD process. Thereafter, the substrate 1 is subjected to a heat treatment in a steam atmosphere. As a result, as shown in FIG. 15, the silicon oxide film 9 with a thickness of, for example, about 3 [nm] is formed in the surface of the silicon nitride film 8. In this step, the thickness of the silicon nitride film 8 decreases from about 18 [nm] to 15 [nm]. Further, in this step, an ONO film (silicon oxide film 7/silicon nitride film 8/silicon oxide film 9) is formed as the gate insulating film of the nonvolatile storage element Qm over the high voltage system p-type well region 4 of the memory cell formation region.

Figure 16:
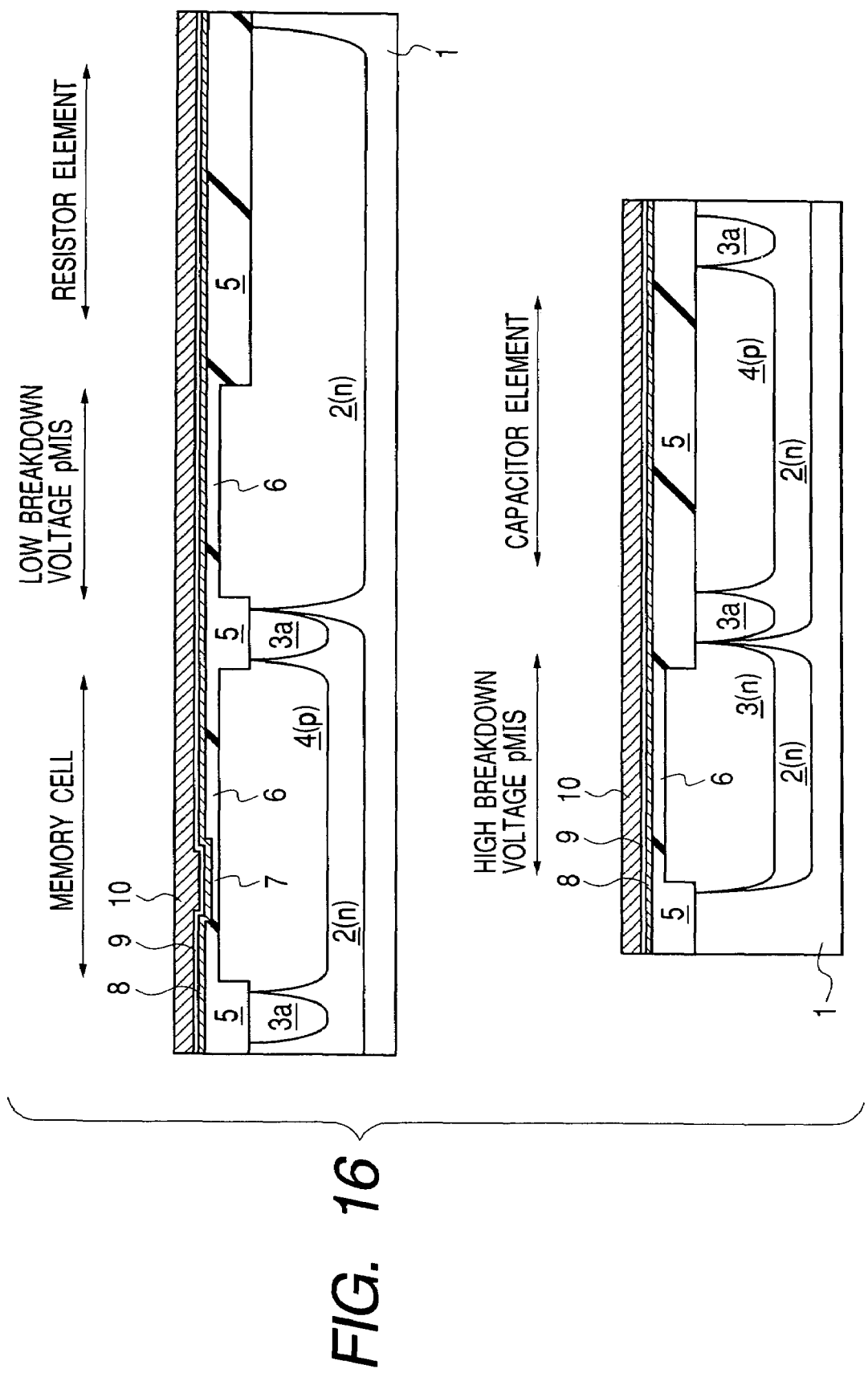
FIG. 16 is a schematic cross sectional view showing the semiconductor integrated circuit device during a manufacturing step subsequent to that of FIG. 15.

Then, as shown in FIG. 16, a first-layer polycrystal silicon film 10 with a thickness of, for example, about 200 [nm] is formed by a CVD process entirely over the silicon oxide film 9, including over the memory cell formation region, and over the first and second element isolation regions. Thereafter, an impurity (e.g., phosphorus (P)) for reducing the resistance value is ion-implanted into the polycrystal silicon film 10, followed by a heat treatment for activating the impurity.

Figure 17:
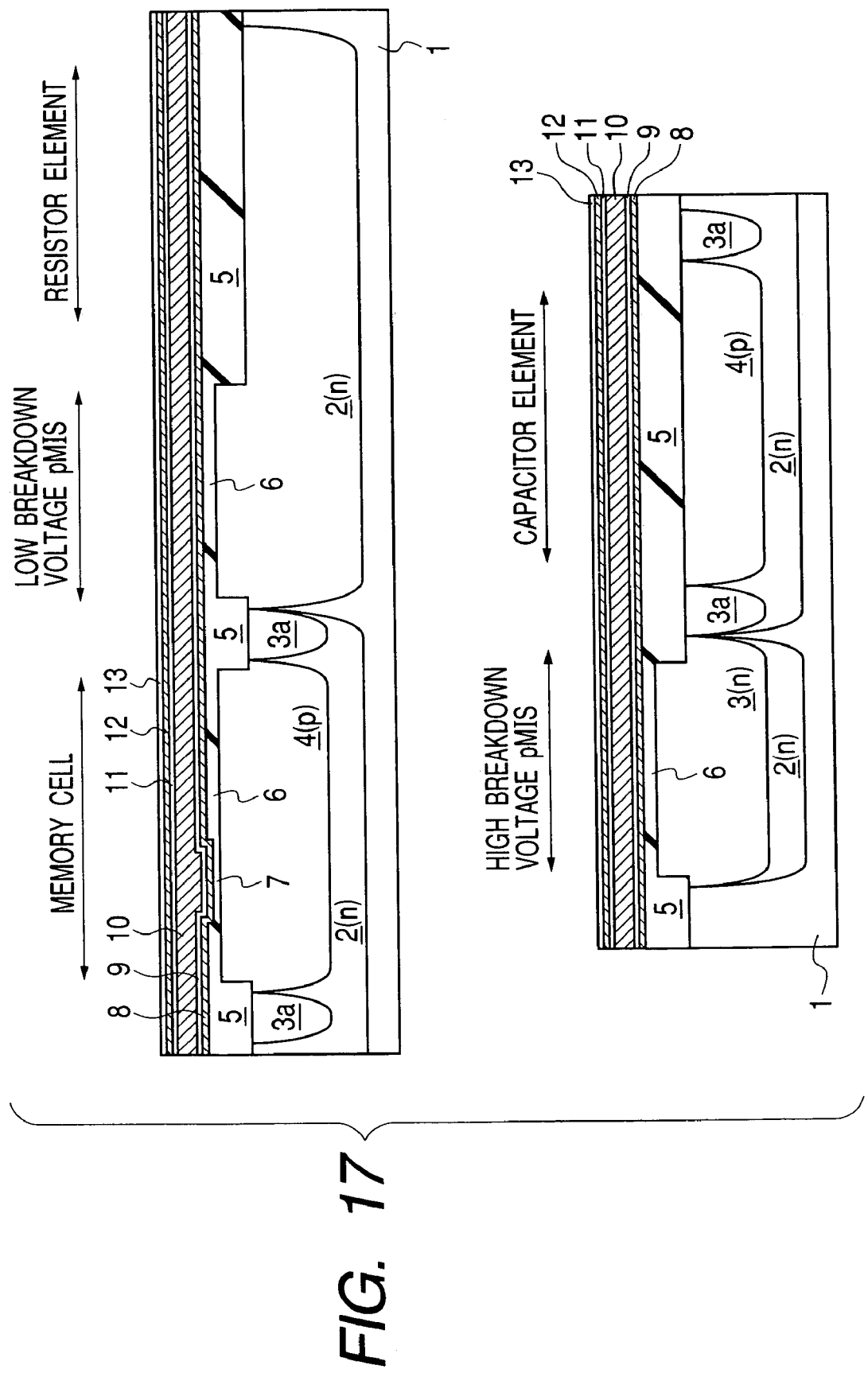
FIG. 17 is a schematic cross sectional view showing the semiconductor integrated circuit device during a manufacturing step subsequent to that shown in FIG. 16.

Then, as shown in FIG. 17, the silicon oxide film 11, the silicon nitride film 12, and the silicon oxide film 13 are formed sequentially from the surface of the polycrystal silicon film 10 by a CVD process entirely over the polycrystal silicon film 10, including the first and second element isolation regions. The silicon oxide film 11 is formed with a thickness of, for example, about 6 [nm]; the silicon nitride film 12 is formed with a thickness of, for example, about 26 [nm]; and the silicon oxide film 13 is formed with a thickness of, for example, about 70 [nm].

Figure 18:
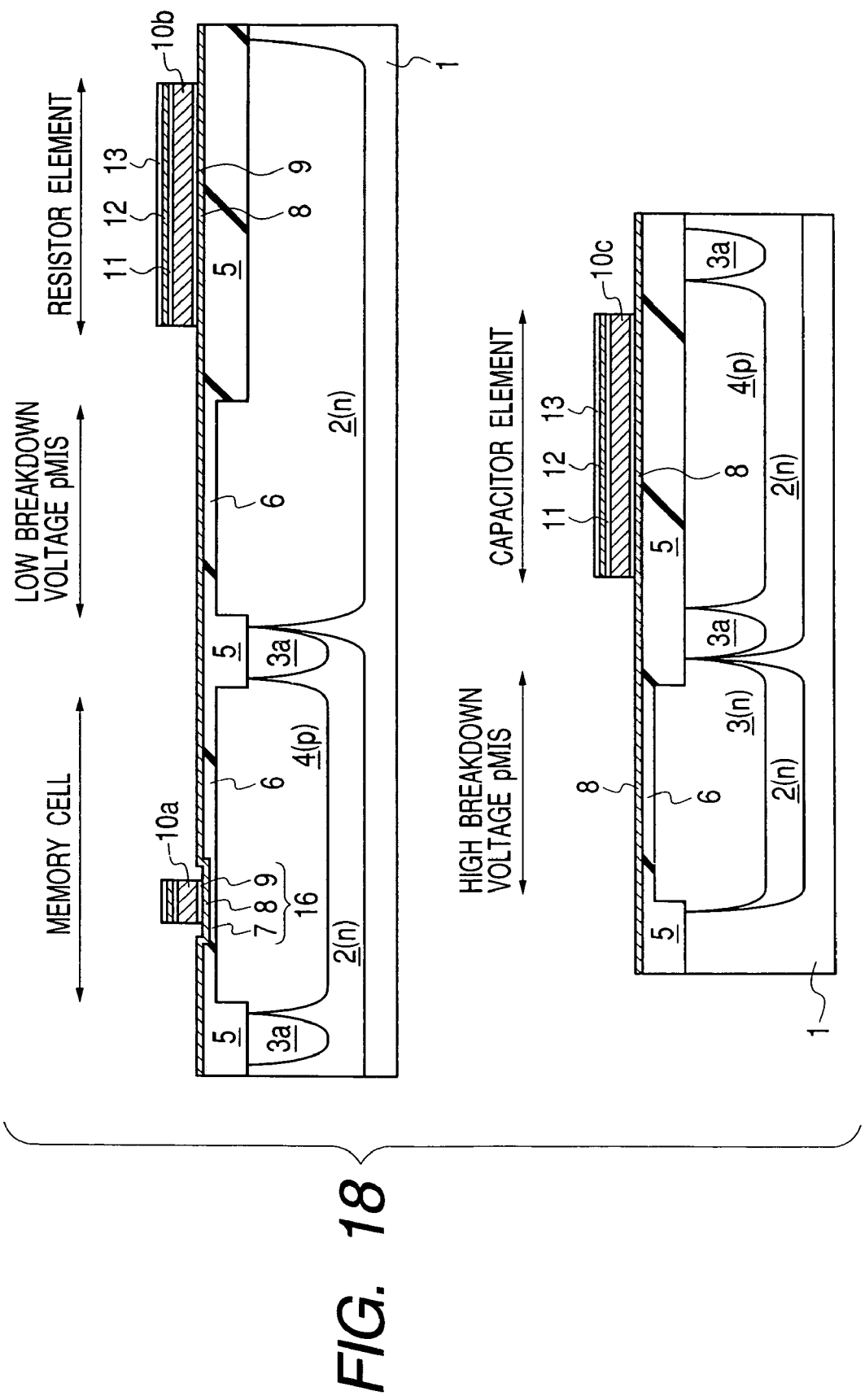
FIG. 18 is a schematic cross sectional view showing the semiconductor integrated circuit device during a manufacturing step subsequent to that of FIG. 17.

Then, the silicon oxide film 13, the silicon nitride film 12, the silicon oxide film 11, and the polycrystal silicon film 10 are sequentially patterned. As a result, as shown in FIG. 18, the gate electrode 10a of the nonvolatile storage element Qm is formed in the memory cell formation region; the resistor element 10b is formed over the first element isolation region; and the lower electrode 10c of the capacitor element C is formed over the second element isolation region. The patterning of the silicon oxide film 13, the silicon nitride film 12, and the silicon oxide film 11 is sequentially carried out by forming a mask composed of, for example, a photoresist film over the silicon oxide film 13, and then using the mask. The patterning of the polycrystal silicon film 10 is carried out by using the ONO film composed of the silicon oxide film 13, the silicon nitride film 12, and the silicon oxide film 11 as a mask.

In this step, the gate electrode 10a of the nonvolatile storage element Qm is formed over the memory cell formation region of the principal surface of the substrate 1 with the gate insulating film 16 composed of the ONO film (the silicon oxide film 7/the silicon nitride film 8/the silicon oxide film 9) being interposed therebetween.

Whereas, the resistor element 10b having its top surface covered with the oxidation resistant film composed of the silicon nitride film 12 is formed over the first element isolation region of the principal surface of the substrate 1 with the oxidation resistant film composed of the silicon nitride film 9 being interposed therebetween.

Further, the lower electrode 10c of the capacitor element C, having its top surface covered with the oxidation resistant film composed of the silicon nitride film 12, is formed over the second element isolation region of the principal surface of the substrate 1 with the oxidation resistant film composed of the silicon nitride film 9 being interposed therebetween.

Still further, the ONO film (the silicon oxide film 11/the silicon nitride film 12/the silicon oxide film 13) for serving as the dielectric film of the capacitor element C is formed over the lower electrode 10c by overetching for the patterning of the polycrystal silicon film 10.

Whereas, in this step, each thickness of the portions of the silicon oxide film 13 over the resistor element 10b and over the lower electrode 10c, and the portions of the silicon oxide film 9 in the peripheries of the resistor element 10b and the lower electrode 10c is reduced.

Figure 19:
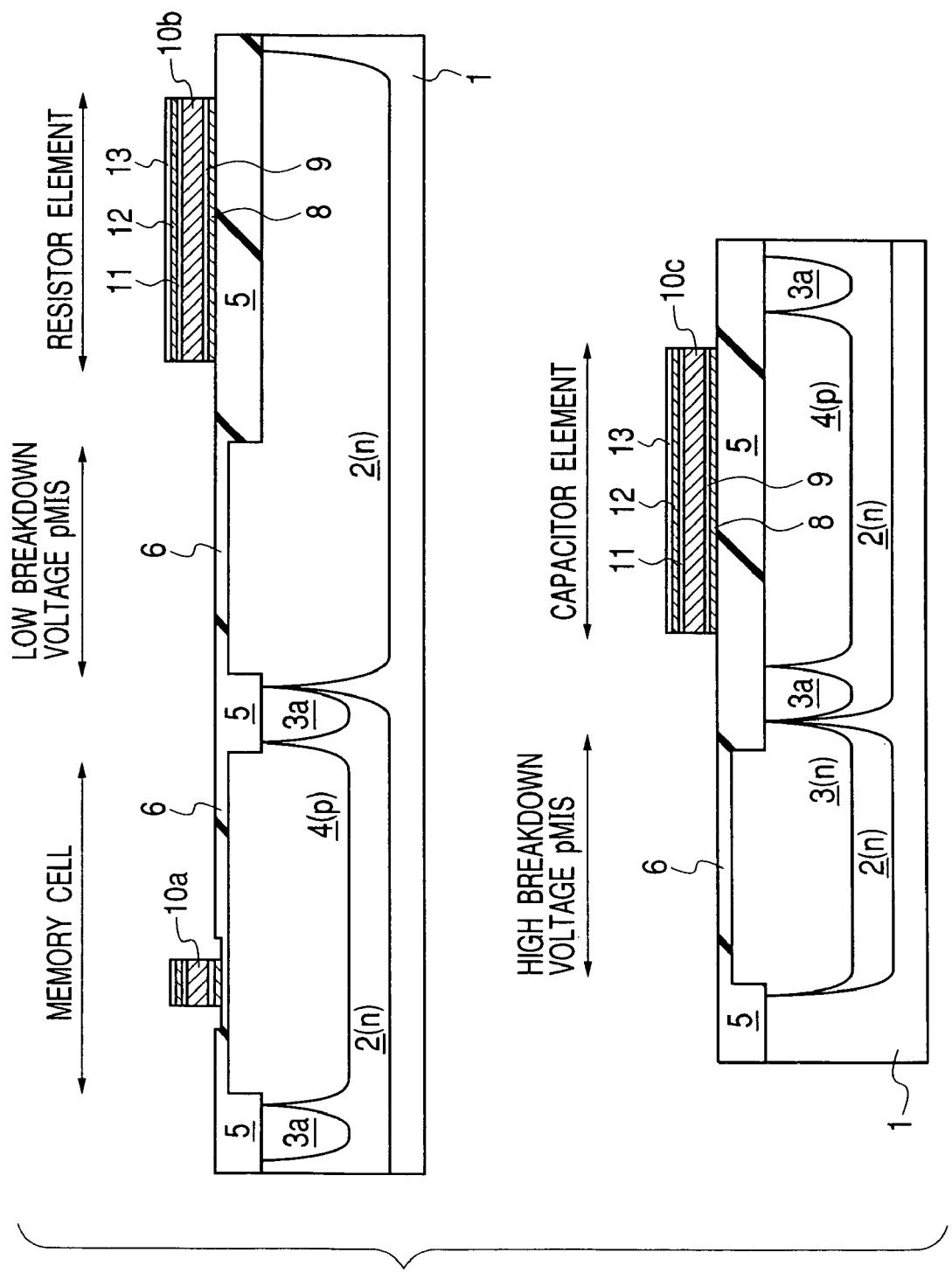
FIG. 19 is a schematic cross sectional view showing the semiconductor integrated circuit device during a manufacturing step subsequent to that shown in FIG. 18.
Figure 20:
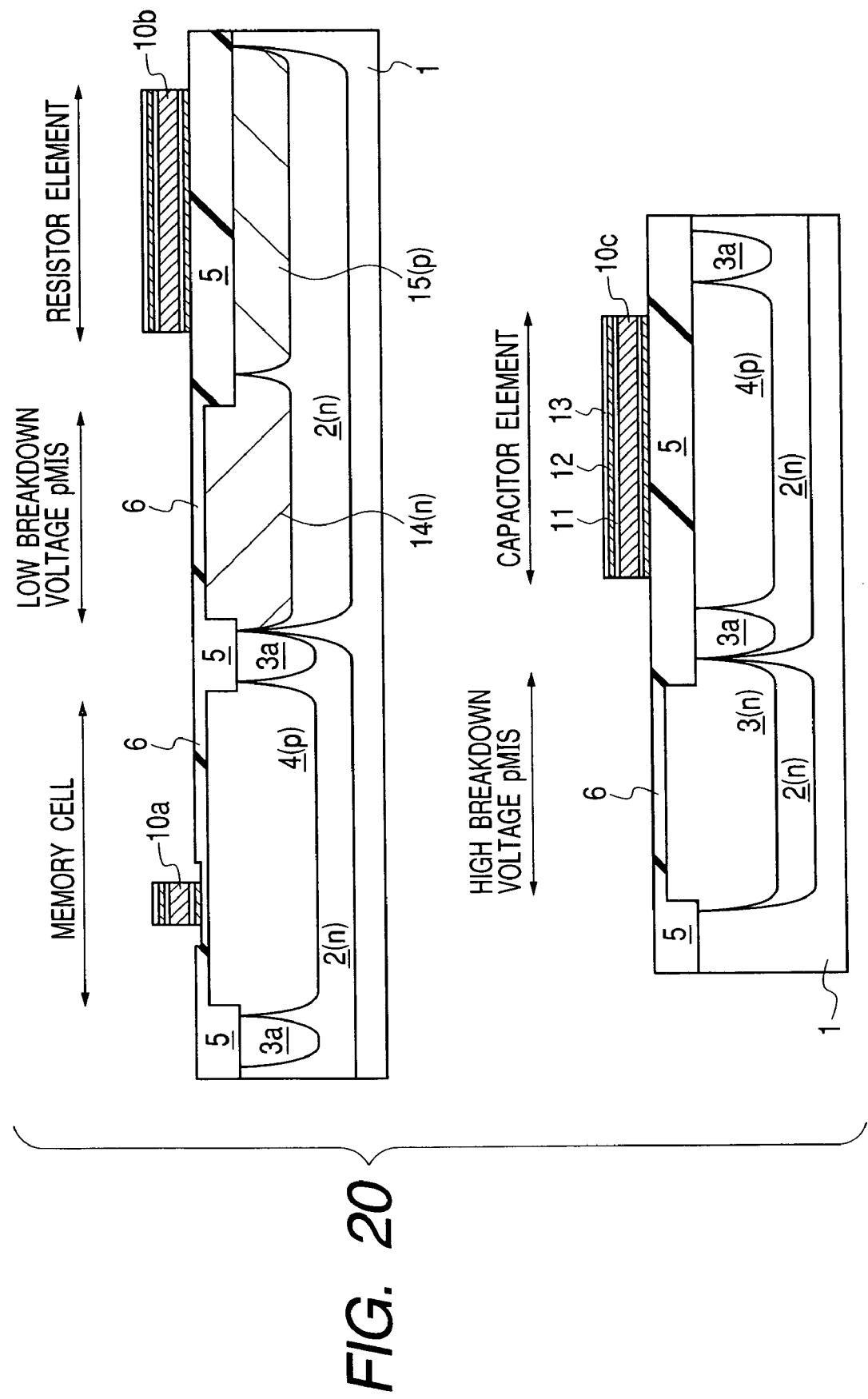
FIG. 20 is a schematic cross sectional view showing the semiconductor integrated circuit device during a manufacturing step subsequent to that of FIG. 19.

Then, as shown in FIG. 19, the portions of the silicon nitride film 8 in the peripheries of the gate electrode 10a, the resistor element 10b, and the lower electrode 10c are removed. Thereafter, an impurity for forming the low voltage system well regions is selectively ion-implanted into the principal surface of the substrate 1, followed by a heat treatment for activating the impurity. As shown in FIG. 20, this results in the formation of the low voltage system n-type well region 14 in the low breakdown voltage pMIS formation region, and the low voltage system p-type well region 15 under the first element isolation region.

As the impurity for forming the low voltage system n-type well region 14, for example, phosphorus (P) is used.

The ion implantation of phosphorus is carried out under the conditions as follows:

The accelerating energy is 360 KeV, and the dose amount is $2.0 \times 10^{13}$ [atoms/cm$^2$];

The accelerating energy is 100 KeV, and the dose amount is $1.5 \times 10^{12}$ [atoms/cm$^2$]; or The accelerating energy is 40 MeV, and the dose amount is $8.0 \times 10^{12}$ [atoms/cm$^2$].

As the impurities for forming the low voltage system p-type well region 15, for example, boron (B) and boron difluroride (BF$_2$) are used.

The ion implantation of boron is carried out under the conditions as follows:

The accelerating energy is 200 KeV, and the dose amount is $1.5 \times 10^{13}$ [atoms/cm$^2$];

The accelerating energy is 120 KeV, and the dose amount is $5.0 \times 10^{12}$ [atoms/cm$^2$]; or The accelerating energy is 50 MeV, and the dose amount is $1.5 \times 10^{12}$ [atoms/cm$^2$].

Whereas, the ion implantation of boron difluoride is carried out under the conditions of an accelerating energy of 60 KeV and a dose amount of $2.0 \times 10^{13}$ [atoms/cm$^2$].

The boron difluoride for forming the low voltage system p-type well region is implanted for controlling the threshold value voltage.

Herein, the formation of the low voltage type well regions (14 and 15) is carried out after forming the gate insulating film of the nonvolatile storage element Qm. Therefore, the low voltage system well regions will not be subjected to the heat treatment for the formation of the silicon oxide film 7 and the heat treatment for the formation of the silicon oxide film 9. Accordingly, it is possible to reduce the number of times the low voltage system well regions are heat-treated.

Figure 21:
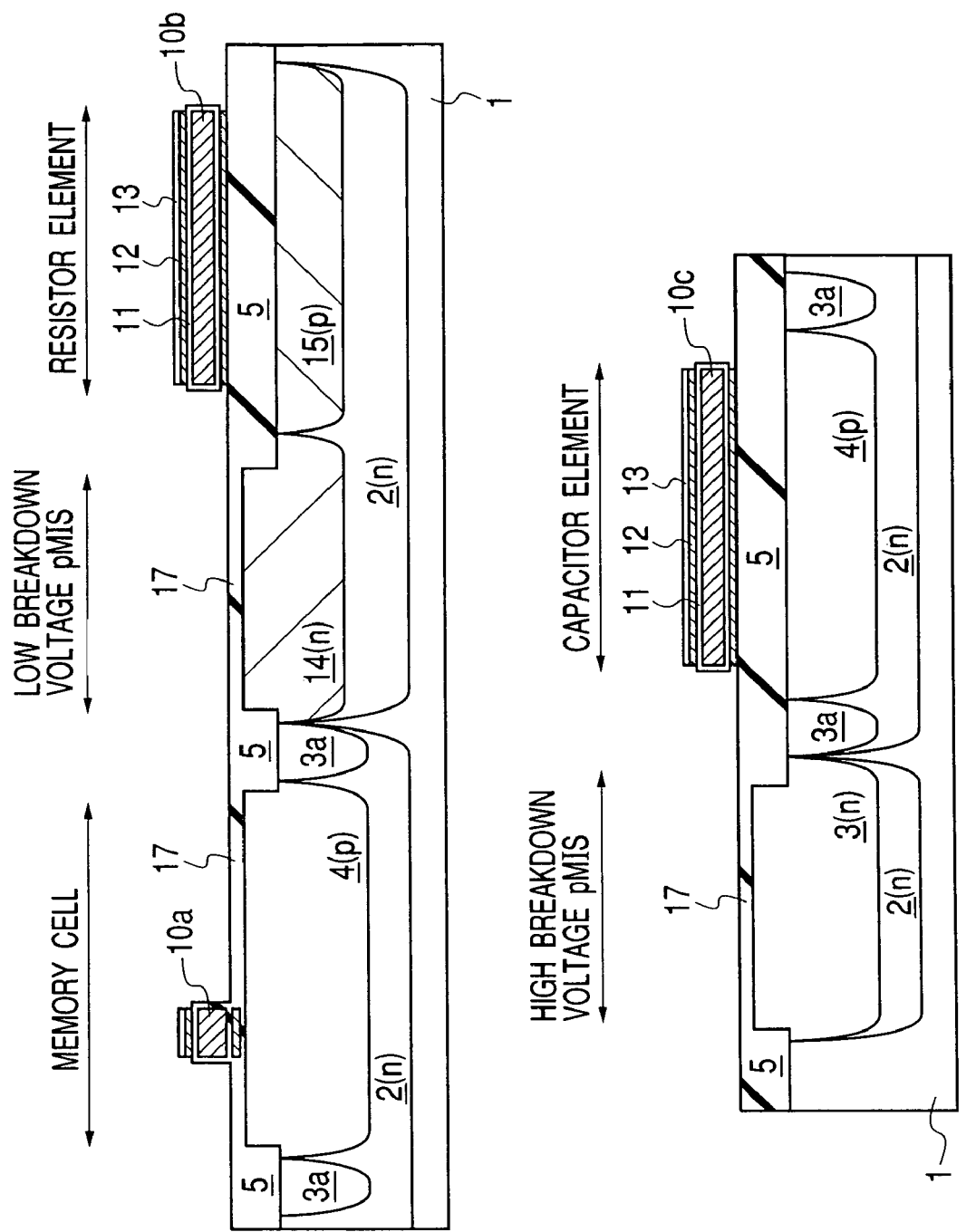
FIG. 21 is a schematic cross sectional view showing the semiconductor integrated circuit device during a manufacturing step subsequent to that of FIG. 20.

Then, the portions of the buffer insulating film 6 over the high voltage system p-type well region 4, over the low voltage system n-type well region 14, and over the high voltage system n-type well region 3 are removed. Subsequently, the substrate 1 is subjected to a heat treatment. As shown in FIG. 21, this results in the formation of the gate insulating film 17, which is composed of a thick silicon oxide film with a thickness of, for example, about 18 [nm], over the high voltage system p-type well region 4, over the low voltage system n-type well region 14, and over the high voltage system n-type well region 3. The removal of the portions of the buffer insulating film 6 reduces the thickness of the portions of the silicon oxide film 13 over the resistor element 10b and over the lower electrode 10c.

In this step, the oxidation resistant film composed of the silicon nitride film 8 is provided between the lower electrode 10c and the second element isolation region. Therefore, it is possible to suppress the oxidation of the bottom surface of the lower electrode 10c. Whereas, the top surface of the lower electrode 10c is covered with the oxidation resistant film composed of the silicon nitride film 12 in the dielectric film. Therefore, it is possible to suppress the oxidation of the lower electrode 10c.

In this step, the oxidation resistant film composed of the silicon nitride film 8 is provided between the resistor element 10b and the first element isolation region. Therefore, it is possible to suppress the oxidation of the bottom surface of the resistor element 10b. Also, the top surface of the resistor element 10b is covered with the oxidation resistant film composed of the silicon nitride film 12. Therefore, it is possible to suppress the oxidation of the resistor element 10b.

Figure 22:
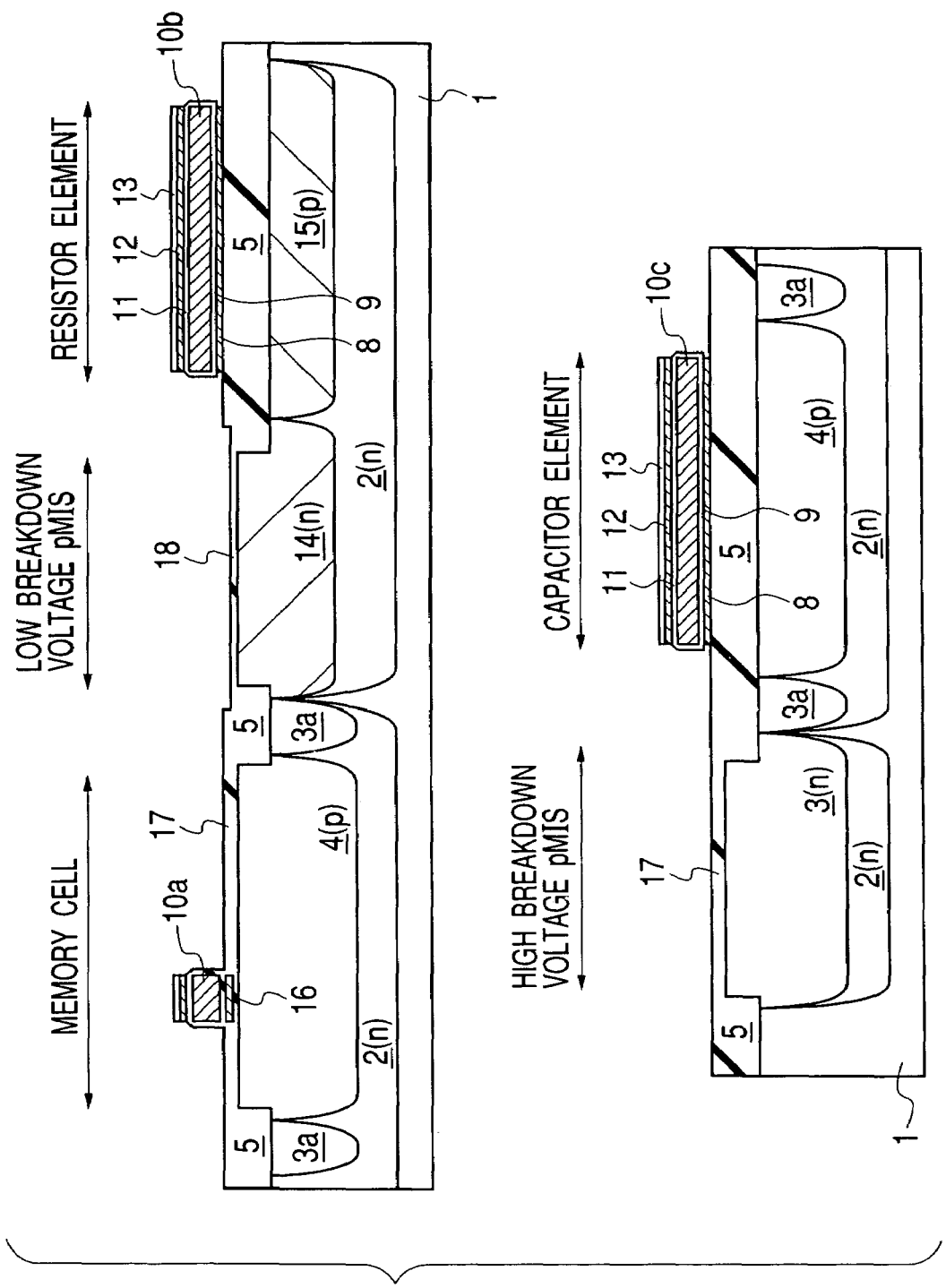
FIG. 22 is a schematic cross sectional view showing the semiconductor integrated circuit device during a manufacturing step subsequent to that shown in FIG. 21.

Then, the gate insulating film 17 over the low voltage system n-type well region 14 is selectively removed. Subsequently, the substrate 1 is subjected to a heat treatment. As shown in FIG. 22, this results in the formation of the gate insulating film 18 composed of a thin silicon oxide film with a thickness of, for example, about 3.7 [nm] over the low voltage system n-type well region 14. With this heat treatment, the thickness of the gate insulating film 17 becomes from 18 [nm] to 19 [nm], and the thickness of the portions of the silicon oxide film 13 over the resistor element 10b and over the lower electrode 10c becomes 1 [nm].

In this step, the oxidation resistant film composed of the silicon nitride film 8 is provided between the lower electrode 10c and the second element isolation region. Therefore, it is possible to suppress the oxidation of the bottom surface of the lower electrode 10c. Also, the top surface of the lower electrode 10c is covered with the oxidation resistant film composed of the silicon nitride film 12 in the dielectric film. Therefore, it is possible to suppress the oxidation of the lower electrode 10c.

In this step, the oxidation resistant film composed of the silicon nitride film 8 is provided between the resistor element 10b and the first element isolation region. Therefore, it is possible to suppress the oxidation of the bottom surface of the resistor element 10b. Also, the top surface of the resistor element 10b is covered with the oxidation resistant film composed of the silicon nitride film 12. Therefore, it is possible to suppress the oxidation of the resistor element 10b.

Figure 23:
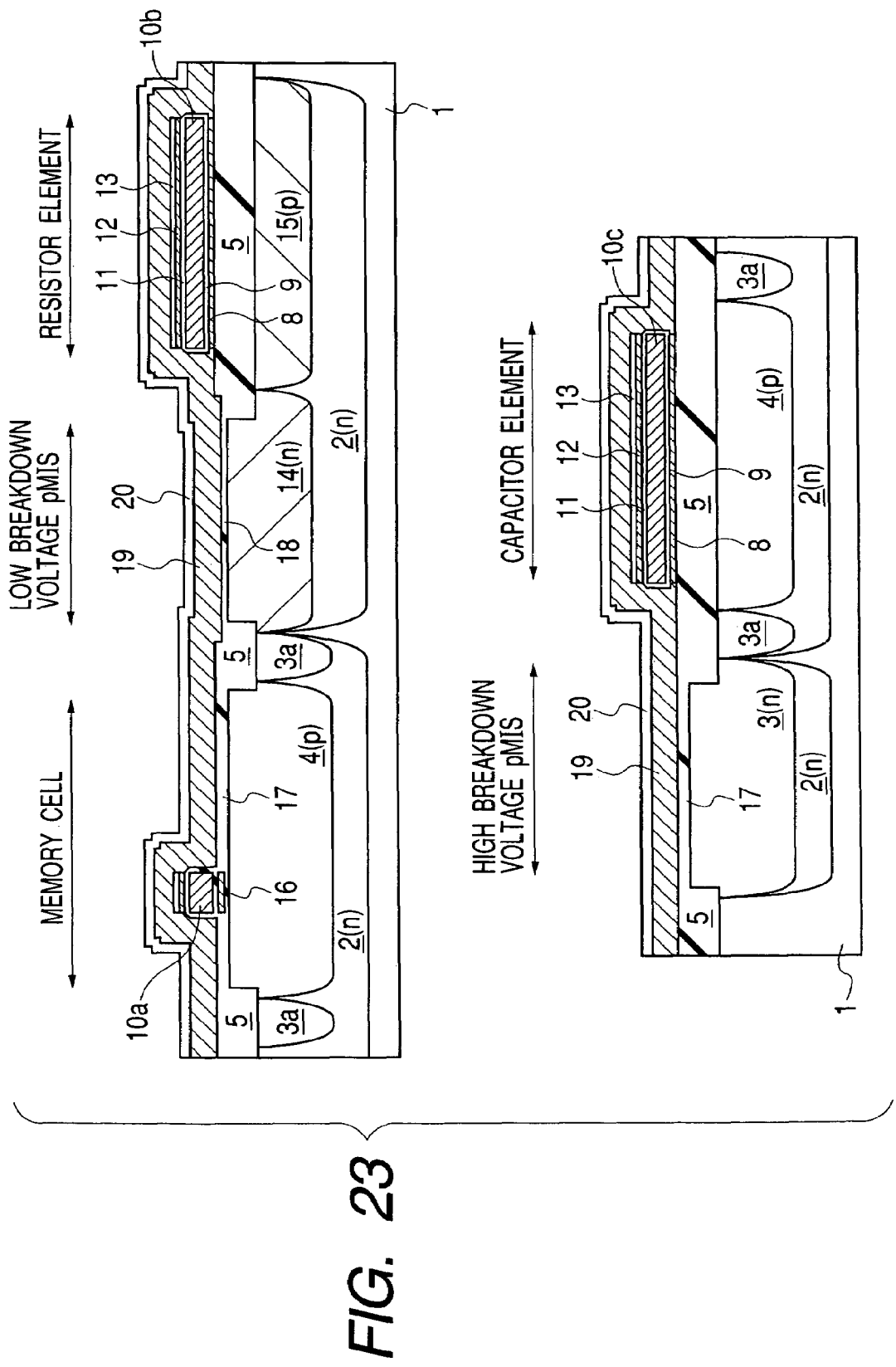
FIG. 23 is a schematic cross sectional view showing the semiconductor integrated circuit device during a manufacturing step subsequent to that of FIG. 22.

Then, as shown in FIG. 23, a second-layer polycrystal silicon film 19 with a thickness of, for example, about 250 [nm] is formed entirely over the principal surface of the substrate 1, including the gate insulating films 17 and 18, and over the silicon oxide film 13 disposed over the lower electrode 10c by a CVD process. Subsequently, an impurity for reducing the resistance value is ion-implanted into the polycrystal silicon film 19, followed by a heat treatment for activating the impurity. Then, as shown in FIG. 23, a silicon oxide film 20 with a thickness of, for example, about 70 [nm] is formed entirely over the polycrystal silicon film 19 by a CVD process.

Figure 24:
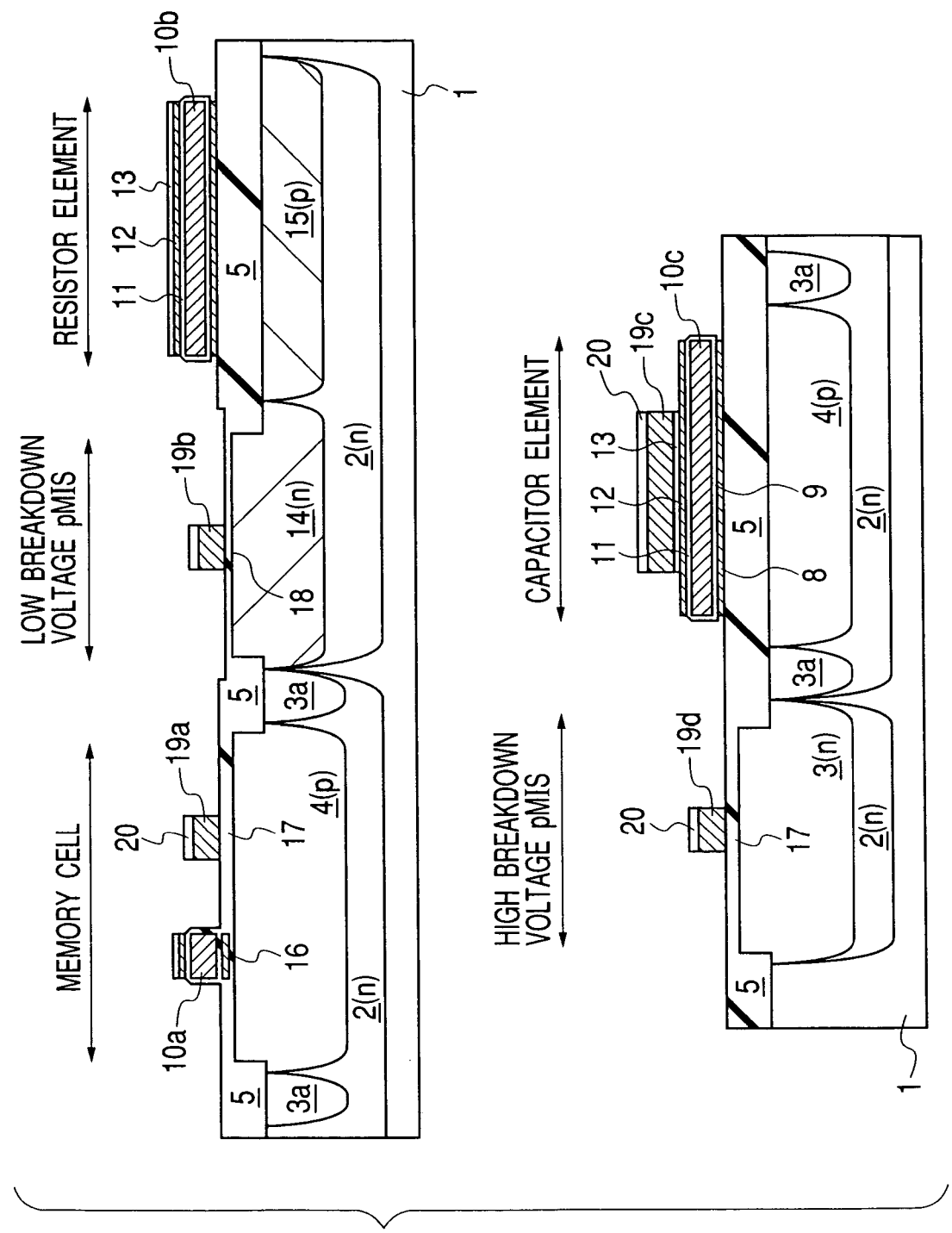
FIG. 24 is a schematic cross sectional view showing the semiconductor integrated circuit device during a manufacturing step subsequent to that shown in FIG. 23.

Then, the silicon oxide film 20 and the polycrystal silicon film 19 are sequentially patterned. As shown in FIG. 24, this results in the formation of the gate electrode 19a of the selecting MISFET-Qs over the gate insulating film 17 of the memory cell formation region, the gate electrode 19b of the low breakdown voltage p-type MISFET-QLp over the gate insulating film 18 of the low breakdown voltage MIS formation region, the gate electrode 19d of the high breakdown voltage p-type MISFET-QHp over the gate insulating film 17 of the high breakdown voltage pMIS formation region, and the upper electrode 19c over the ONO film over the lower electrode 10c.

Figure 25:
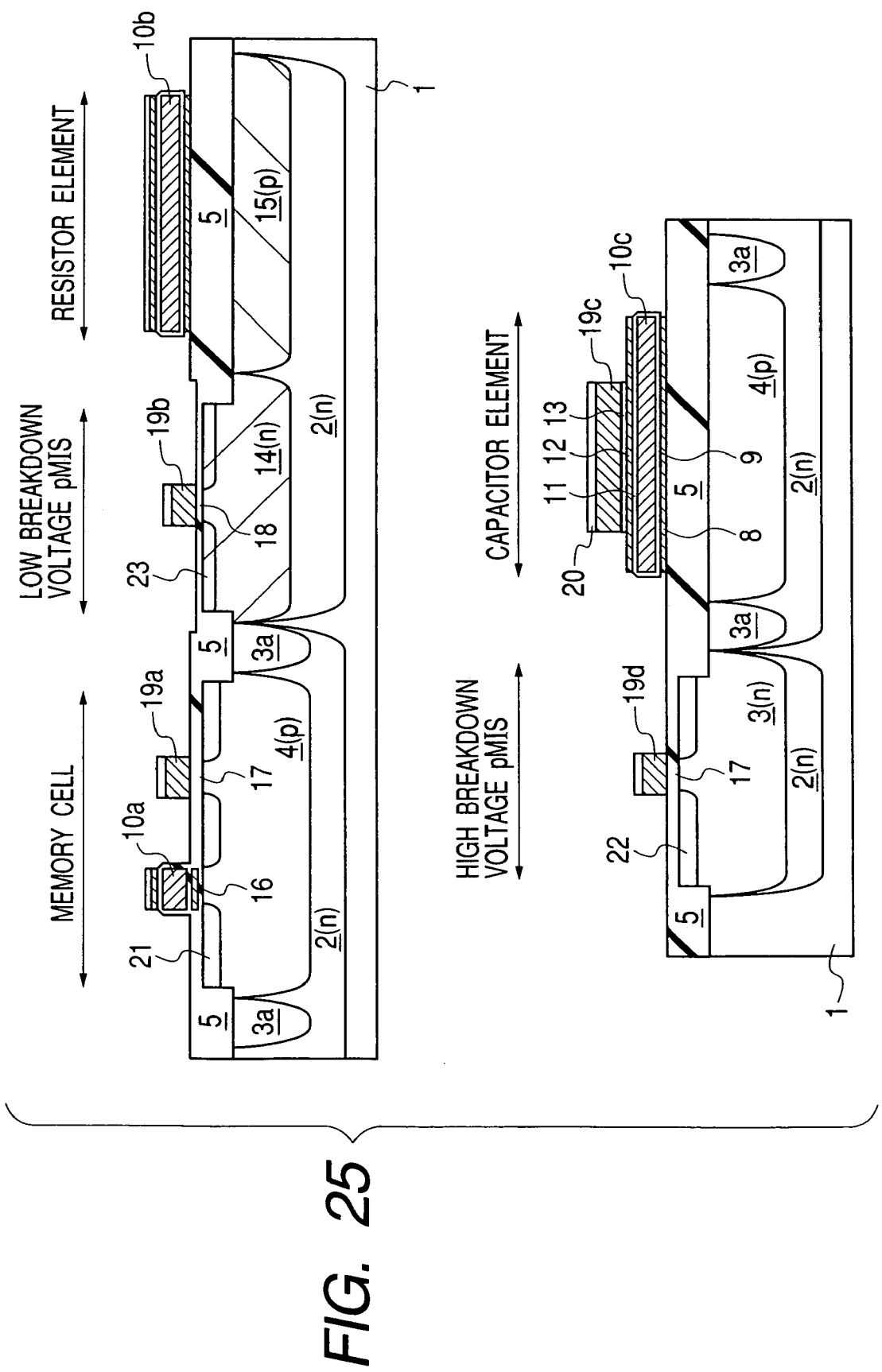
FIG. 25 is a schematic cross sectional view showing the semiconductor integrated circuit device during a manufacturing step subsequent to that of FIG. 24.

Then, an impurity (e.g., phosphorus), impurities (e.g., boron difluoride, and phosphorus for punch through stopper), and an impurity (e.g., boron difluoride) are selectively ion-implanted into the high voltage system p-type well region 4 of the memory cell formation region, the low voltage system n-type well region 14 of the low breakdown voltage pMIS formation region, and the high voltage system n-type well region 3 of the high breakdown voltage pMIS formation region, respectively. As shown in FIG. 25, this results in the formation of the n-type semiconductive regions (extension regions) 21 in alignment with the gate electrode 10a and the n-type semiconductive regions (extension regions) 21 in alignment with the gate electrode 19a in the high voltage system p-type well region 4 of the memory cell formation region, the p-type semiconductive regions (extension regions) 23 in alignment with the gate electrode 19b in the low voltage system n-type well region 14 of the low breakdown voltage pMIS formation region, and the p-type semiconductive regions (extension regions) 22 in alignment with the gate electrode 19d in the high voltage system n-type well region 3 of the high breakdown voltage pMIS formation region.

Figure 26:
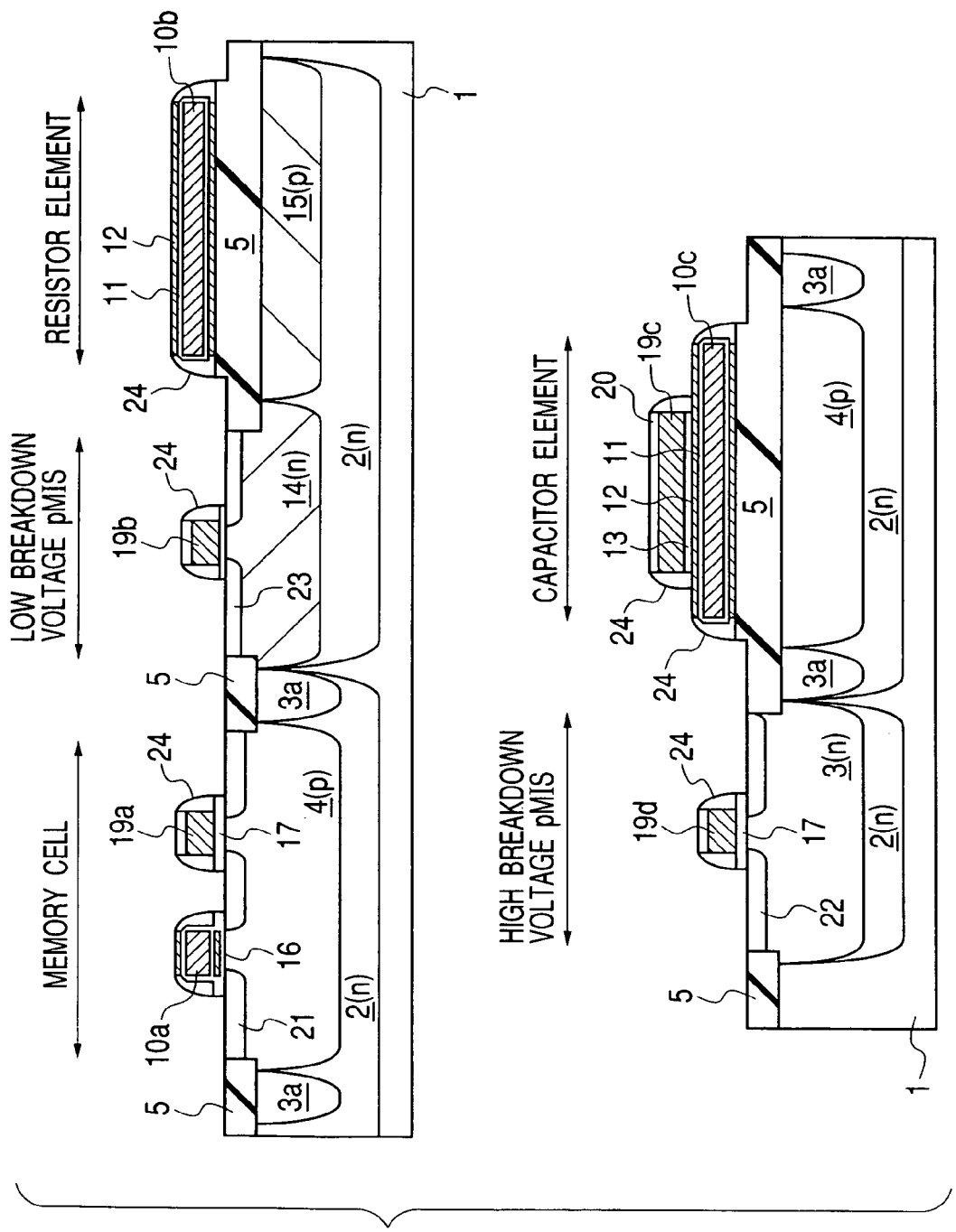
FIG. 26 is a schematic cross sectional view showing the semiconductor integrated circuit device during a manufacturing step subsequent to that of FIG. 25.

Then, as shown in FIG. 26, the sidewall spacers 24 are formed on the respective sidewalls of the gate electrodes 10a, 19a, 19b, and 19d. The sidewall spacers 24 are formed in the following manner. An insulating film composed of, for example, a silicon oxide film is formed entirely over the principal surface of the substrate 1 by a CVD process. Subsequently, the insulating film is subjected to anisotropic etching, such as RIE (Reactive Ion Etching). In this step, each sidewall spacer 24 is formed in alignment with its corresponding gate electrode. Further, the sidewall spacers 24 are also formed on the respective sidewalls of the resistor element 10b, the lower electrode 10c, and the upper electrode 19c.

Figure 27:
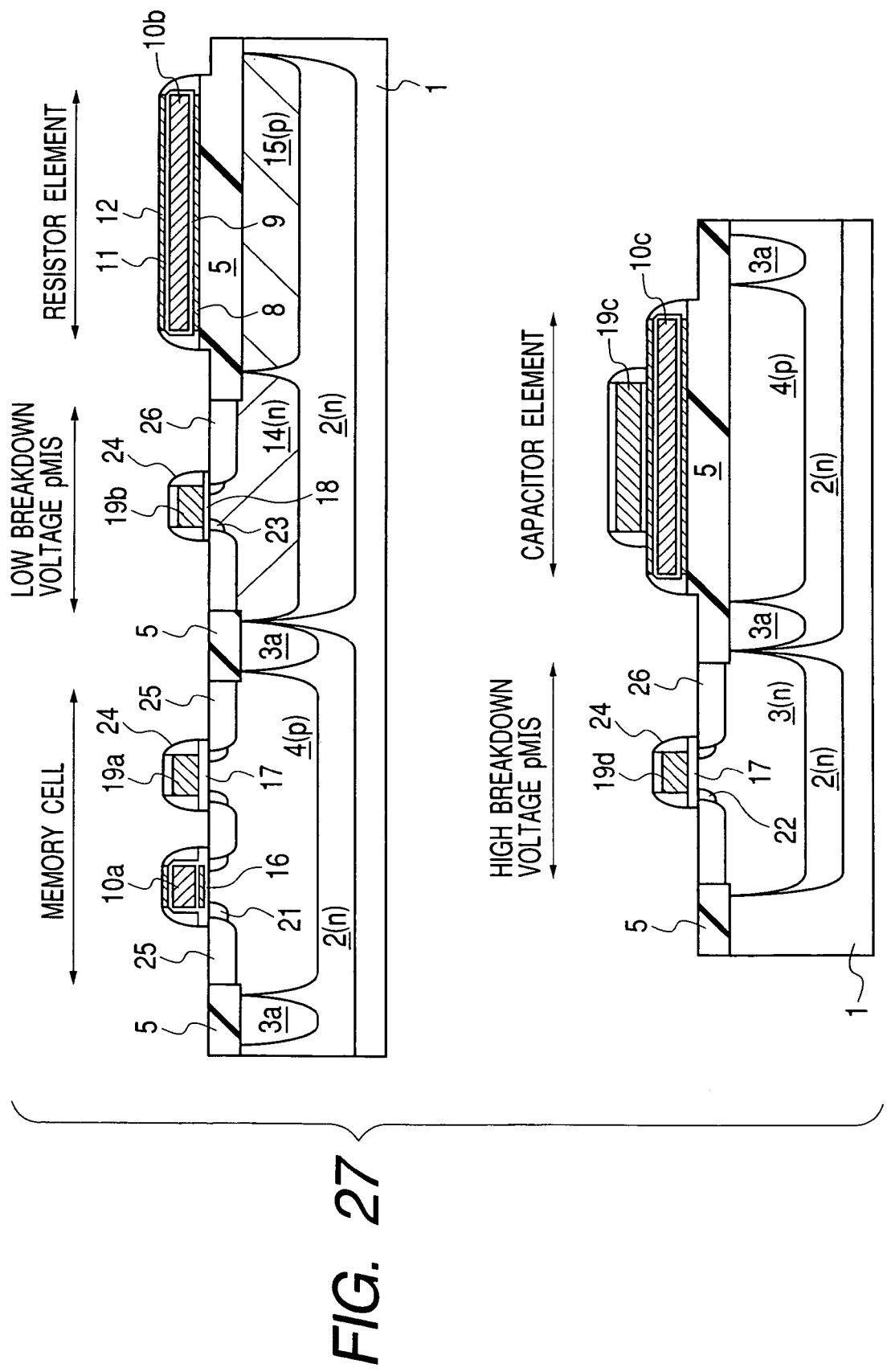
FIG. 27 is a schematic cross sectional view showing the semiconductor integrated circuit device during a manufacturing step subsequent to that shown in FIG. 26.

Then, impurities (e.g., phosphorus and arsenic) are selectively ion-implanted into the high voltage system p-type well region 4 of the memory cell formation region. As shown in FIG. 27, this results in the formation of the n-type semiconductive regions (contact regions) 25 in alignment with the sidewall spacer 24 in the high voltage system p-type well region 4 of the memory cell formation region. Also, impurities (e.g., boron difluoride and boron) are selectively ion-implanted into the low voltage system n-well region 14 of the low breakdown voltage pMIS formation region, and the high voltage system n-type well region of the high breakdown voltage pMIS formation region. As shown in FIG. 27, this results in the formation of the p-type semiconductive regions (contact regions) 26 in alignment with the sidewall spacer 24 in the low voltage system n-type well region 14 of the low breakdown voltage pMIS formation region and the high voltage system n-type well region of the high breakdown voltage pMIS formation region.

Figure 28:
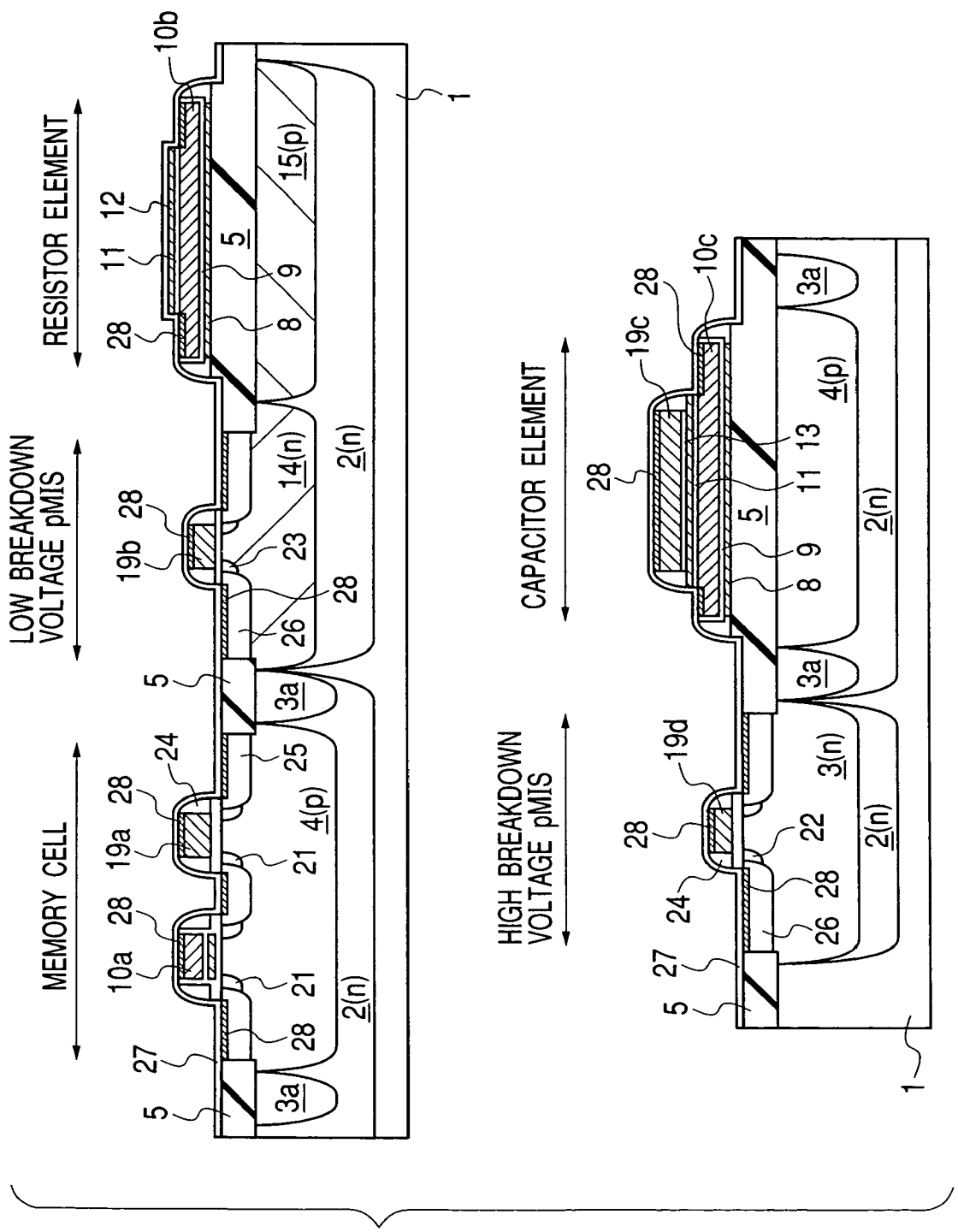
FIG. 28 is a schematic cross sectional view showing the semiconductor integrated circuit device during a manufacturing step subsequent to that of FIG. 27.

Then, a natural oxide film and the like are removed to expose the surfaces of the gate electrodes (10a, 19a, 19b, and 19d), the surfaces of the contact regions of the resistor element 10b, the surface of the contact region of the lower electrode 10c, and the surface of the upper electrode 19c. Then, entirely over the principal surface of the substrate 1, including over these surfaces, for example, a cobalt film 27 is formed as a refractory metal film by a sputtering process. Subsequently, a heat treatment for causing the reaction of the silicon (Si) of the semiconductive regions (25 and 26), the Si in the gate electrodes (10a, 19a, 19b, and 19d), the Si in the contact regions of the resistor element 10b, the Si in the contact region in the lower electrode 10c, and the Si in the upper electrode 19c with the Co in the cobalt film 27 is conducted. As shown in FIG. 28, this results in the formation of a silicide (CoSi) layer 28, which is a metal/semiconductor reaction layer in the surfaces of the semiconductive regions (25 and 26), the surfaces of the gate electrodes (10a, 19a, 19b, and 19d), the surfaces of the contact regions of the resistor element 10b, the surface of the contact region of the lower electrode 10c, and the surface of the upper electrode 19c. The silicide layer 28 is formed in alignment with the sidewall spacers 24.

Then, the unreacted cobalt film 27 in a region other than the region in which the silicide layer 28 has been formed is selectively removed, followed by a heat treatment for activating the silicide layer 28 (to $CoSi_2$).

With this step, the nonvolatile storage element Qm, the selecting MISFET-Qs, the low breakdown voltage p-type MISFET-QLp, the high breakdown voltage p-MISFET-QHp, the resistor element 10b, and the capacitor element C are almost completed.

Then, the interlayer insulating film 29, which is composed of, for example, a silicon oxide film, is formed entirely over the principal surface of the substrate 1, including over the foregoing active elements and passive elements, by a CVD process. Subsequently, the surface of the interlayer insulating film 29 is planarized by a CVD process.

Then, the contact holes for the sources/the drains, the contact holes for the gates, the contact holes for the resistor element, the contact hole for the lower electrode, and the contact hole for the upper electrode, reaching from the surface of the interlayer insulating film 29 to the silicide layer 28 are formed. Subsequently, a conductive substance, such as a metal, is embedded inside the contact holes to form the conductive plugs 30. Thereafter, the wiring 31 is formed over the interlayer insulating film 29, resulting in the configuration shown in FIGS. 1 to 4.

Figure 11:
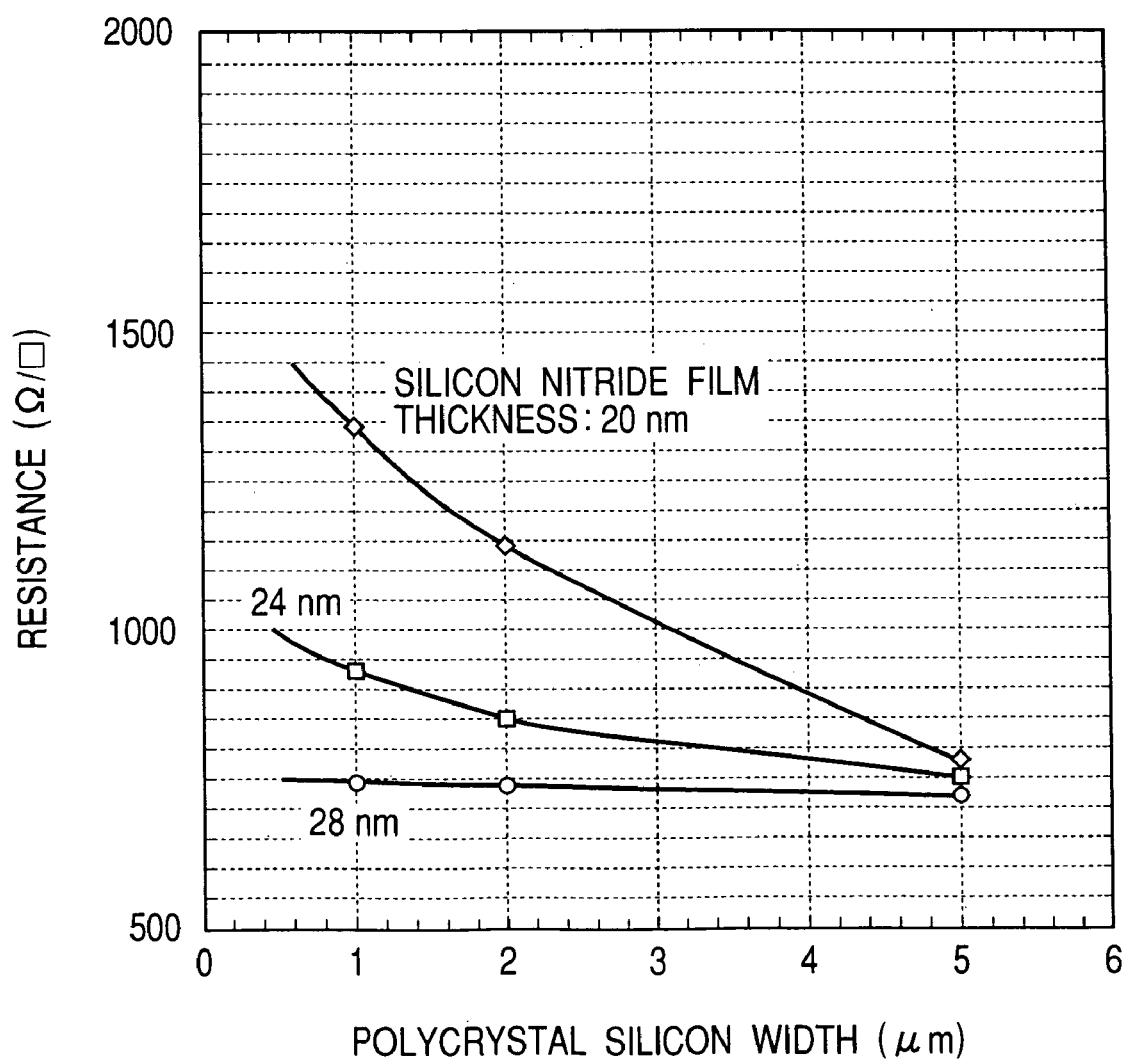
FIG. 11 is a graph showing the polycrystal silicon width dependency of the resistance value in the resistor element of one embodiment of the present invention.

FIG. 11 is a graph showing the polycrystal silicon width dependency of the resistance value in the resistor element 10b. The thickness of the silicon nitride film 12, when deposited over the resistor element 10b, is taken as a parameter. As shown in FIG. 11, as the silicon nitride film 12 increases in thickness, the oxidation from the sides of the polycrystal silicon film during the step is more greatly suppressed, and the thin wire effect is suppressed. When the width of the polycrystal silicon film is reduced to 1 [nm] or less, the thickness of the silicon nitride film 12 when deposited is desirably 24 [nm] or more.

Thus, in accordance with this embodiment, the following effects are obtainable.

The oxidation resistant film composed of the silicon nitride film 8 is provided between the second element isolation region of the principal surface of the substrate 1 and the lower electrode 10c. The top surface of the lower electrode 10c is covered with the oxidation resistant film composed of the silicon nitride film 12. In this state, a heat treatment is carried out to form the gate insulating films 17 and 18 composed of the silicon oxide film in the principal surface of the substrate 1. As a result, it is possible to suppress the oxidation of the bottom surface and the top surface of the lower electrode 10c. Further, it is possible to suppress the formation of bird's beaks each extending from the side of the lower electrode 10c along the interface between the lower electrode 10c and the second element isolation region. Accordingly, it is possible to suppress any warping of the lower electrode 10c caused by the birds beaks. This can suppress the deficiency that the lower electrode 10*c* is peeled off. As a result, it is possible to implement the capacitor element C with a small occupying area and a large capacitance.

Further, it is possible to manufacture a system LSI in which a capacitor element C is mounted with a small occupying area and a large capacitance at a high yield.

The oxidation resistant film between the second element isolation region and the lower electrode 10*c* is formed by the same process as that used for the silicon nitride film 8 in the gate insulating film of the nonvolatile storage element Qm. The oxidation resistant film over the lower electrode 10*c* is the silicon nitride film 12 in the dielectric film of the capacitor element C. Therefore, it is possible to implement the capacitor element C with a small occupying area and a large capacitance without increasing the number of manufacturing steps, and it is possible to manufacture a system LSI in which a capacitor element C is mounted with a large capacitance at a high yield.

The oxidation resistant film composed of the silicon nitride film 8 is provided between the first element isolation region of the principal surface of the substrate 1 and the resistor element 10*b*. Also, the top surface of the resistor element 10*b* is covered with the oxidation resistant film composed of the silicon nitride film 12. In this state, a heat treatment is carried out to form the gate insulating films 17 and 18 composed of the silicon oxide film over the principal surface of the substrate 1. As a result, it is possible to suppress the oxidation of the bottom surface and the top surface of the resistor element 10*b*. Therefore, even if the resistor element 10*b* is formed of the first-layer polycrystal silicon film 10, it is possible to form a high resistive resistor element 10*b* with stability.

The oxidation resistant film between the first element isolation region and the resistor element 10*b* is formed by the same process as that used for the silicon nitride film 8 in the gate insulating film of the nonvolatile storage element Qm. The oxidation resistant film over the lower electrode 10*c* is formed by the same process as that used for the silicon nitride film 12 in the dielectric film of the capacitor element C. Therefore, it is possible to stably form the high resistive resistor element 10*b* without increasing the number of manufacturing steps.

After the formation of the gate insulating film 16 composed of the ONO film of the nonvolatile storage element Qm, the low voltage system well regions (14 and 15) are formed. This can reduce the number of times the low voltage system well regions are heat treated. Therefore, it is possible to suppress the reduction in surface impurity concentration of the low voltage system well regions. As a result, it is possible to form a high breakdown voltage MISFET without affecting the characteristics of a general low breakdown voltage MISFET.

Up to this point, the invention completed by the present inventors has been specifically described based on an exemplary embodiment. However, the present invention is not limited to the foregoing embodiment, and various modifications may be naturally made in a scope not departing from the gist thereof.

The effects obtainable with typical features of the invention disclosed in this application will be briefly described as follows.

In accordance with the present invention, it is possible to implement a capacitor element with a small occupying area and a large capacitance.

In accordance with the present invention, it is possible to implement a high resistive resistor element.

In accordance with the present invention, it is possible to form a high breakdown voltage MISFET without affecting the characteristics of a low breakdown voltage MISFET In accordance with the present invention, it is possible to improve the yield in the manufacture of a semiconductor integrated circuit device.

What we claim is:

1. A method of manufacturing a semiconductor integrated circuit device including a non-volatile memory cell formed in a non-volatile memory cell forming region of a semiconductor substrate, a resistor element formed in a resistor element forming region of said semiconductor substrate and a first transistor formed in a first transistor forming region of said semiconductor substrate, comprising steps of:

forming a groove in said semiconductor substrate such that said groove defines an active region in said non-volatile memory cell forming region;

filling a first insulating film in said groove by polishing an insulating film formed over said substrate such that said first insulating film is formed in said resistor element forming region and in said non-volatile memory cell forming region;

forming a second insulating film over said active region in said non-volatile memory cell forming region, and, in a same step, forming said second insulating film over said first insulating film in said resistor element forming region;

forming a first conductive film over said second insulating film in said non-volatile memory cell forming region, and, in a same step, forming said first conductive film over said second insulating film in said resistor element forming region; and after said first conductive film forming step, forming a third insulating film and a second conductive film in the first transistor forming region, wherein said second insulating film formed over said active region serves as a gate insulating film of said non-volatile memory cell, wherein said second insulating film formed over said active region is configured for storing information of said non-volatile memory cell, wherein said first conductive film formed in said non-volatile memory cell forming region serves as a gate electrode of said non-volatile memory cell, wherein said first conductive film formed in said resistor element forming region serves as said resistor element, wherein said third insulating film serves as a gate insulating film of a first transistor, and wherein said second conductive film serves as a gate electrode of said first transistor.

2. A method of manufacturing a semiconductor integrated circuit device according to claim 1,
   wherein said second insulating film is formed by a chemical vapor deposition (CVD) method.

3. A method of manufacturing a semiconductor integrated circuit device according to claim 1,
   wherein said second insulating film has a thickness thicker than said third insulating film.

4. A method of manufacturing a semiconductor integrated circuit device according to claim 1,
   wherein said second insulating film formed in said resistor element forming region serves as an oxide resistant film.

5. A method of manufacturing a semiconductor integrated circuit device according to claim 1,
   wherein said first conductive film is formed of poly-silicon film.

6. A method of manufacturing a semiconductor integrated circuit device including a memory cell formed in a nonvolatile memory cell forming region of a semiconductor substrate, a resistor element formed in a resistor element forming region of said semiconductor substrate and a first transistor formed in a first transistor forming region of said semiconductor substrate, comprising steps of:
- (a) forming grooves in a semiconductor substrate;
- (b) after said step (a), depositing a first silicon oxide film over said semiconductor substrate including said grooves;
- (c) after said step (b), polishing said first silicon oxide film formed over said semiconductor substrate such that said first silicon oxide film is embedded in said grooves;
- (d) after said step (c), forming a first silicon nitride film over said non-volatile memory cell forming region, and, in a same step, forming said first silicon nitride film over said first silicon oxide film of said resistor element forming region, wherein said first silicon nitride film formed over said non-volatile memory cell forming region is configured for storing information of said non-volatile memory cell;
- (e) after said step (d), forming a gate electrode of said non-volatile memory cell over said first silicon nitride film formed over said non-volatile memory cell forming region, and, in a same step, forming said resistor element over said first silicon nitride film formed over said resistor element forming region;
- (f) after said step (e), forming a second silicon oxide film over a first transistor forming region; and
- (g) after said step (f), forming a gate electrode of a first transistor over said second silicon oxide film.

7. A method of manufacturing a semiconductor integrated circuit device according to claim 6,
wherein said first silicon nitride film is formed by a chemical vapor deposition (CVD) method.

8. A method of manufacturing a semiconductor integrated circuit device according to claim 6,
wherein said first silicon nitride film formed in said resistor element forming region serves as an oxide resistant film.

9. A method of manufacturing a semiconductor integrated circuit device according to claim 6,
wherein said gate electrode of said non-volatile memory cell and said resistor element are formed of poly-silicon films.

10. A method of manufacturing a semiconductor integrated circuit device including a resistor element formed in a resistor element forming region of a semiconductor substrate and a first transistor formed in a first transistor forming region of said semiconductor substrate, comprising steps of:
- (a) forming grooves in a semiconductor substrate;
- (b) after said step (a), depositing a first silicon oxide film over said semiconductor substrate including said grooves;
- (c) after said step (b), polishing said first silicon oxide film formed over said semiconductor substrate such that said first silicon oxide film is embedded in said grooves;
- (d) after said step (c), forming a first silicon nitride film over said first silicon oxide film of said resistor element forming region;
- (e) after said step (d), forming said resistor element over said first silicon nitride film;
- (f) after said step (e), forming a second silicon oxide film over a first transistor forming region; and
- (g) after said step (f), forming a gate electrode of a first transistor over said second silicon oxide film.

11. A method of manufacturing a semiconductor integrated circuit device according to claim 10,
wherein said first silicon nitride film is formed by a chemical vapor deposition (CVD) method.

12. A method of manufacturing a semiconductor integrated circuit device according to claim 10,
wherein said first silicon nitride film formed in said resistor element forming region serves as an oxide resistant film.

13. A method of manufacturing a semiconductor integrated circuit device according to claim 10,
wherein said resistor element is formed of poly-silicon film.

* * * * *